(12) United States Patent
Ranmuthu

(10) Patent No.: US 9,870,984 B2
(45) Date of Patent: Jan. 16, 2018

(54) POWER FIELD-EFFECT TRANSISTOR (FET), PRE-DRIVER, CONTROLLER, AND SENSE RESISTOR INTEGRATION FOR MULTI-PHASE POWER APPLICATIONS

(71) Applicant: Texas Instruments Incorporated, Dallas, TX (US)

(72) Inventor: Indumini Ranmuthu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/965,697

(22) Filed: Dec. 10, 2015

(65) Prior Publication Data

US 2016/0172280 A1    Jun. 16, 2016

Related U.S. Application Data

(60) Provisional application No. 62/090,197, filed on Dec. 10, 2014.

(51) Int. Cl.
*H01L 23/495* (2006.01)
*H01L 27/088* (2006.01)
(Continued)

(52) U.S. Cl.
CPC .. *H01L 23/49568* (2013.01); *H01L 23/49524* (2013.01); *H01L 23/49548* (2013.01);
(Continued)

(58) Field of Classification Search
CPC ......... H01L 23/49568; H01L 23/49551; H01L 23/49548; H01L 23/49524; H01L 24/40;
(Continued)

(56) References Cited

U.S. PATENT DOCUMENTS 6,031,279 A * 2/2000 Lenz ................. H01L 25/18
257/686
6,055,148 A * 4/2000 Grover .............. H01L 25/16
257/762

(Continued)

FOREIGN PATENT DOCUMENTS

JP    H04209568 A    7/1992
JP    2001309690 A    2/2001
(Continued)

OTHER PUBLICATIONS

International Search Report and Written Opinion of the International Searching Authority, PCT/US 2015/065091, mailed Mar. 31, 2016 (5 pages).

(Continued)

*Primary Examiner* — Hoang-Quan Ho
(74) *Attorney, Agent, or Firm* — Gregory J. Albin; Charles A. Brill; Frank D. Cimino

(57) ABSTRACT

Techniques are described for integrating power field-effect transistors (FETs), pre-drivers, controllers, and/or resistors into a common multi-chip package for implementing multi-phase bridge circuits. The techniques may provide a multi-chip package with at least two high-side (HS) FETs and at least two low-side (LS) FETs, and place the at least two HS FETs or the at least LS FETs on a common die. Placing at least two FETs on a common die may reduce the number of die and the number of thermal pads (i.e., die pads) needed to implement a set of power FETs, thereby decreasing component count of a multi-phase bridge circuit and/or allowing a more compact, higher current density multi-phase bridge circuit to be obtained without significantly increasing thermal power dissipation of the circuit.

21 Claims, 18 Drawing Sheets

(51) Int. Cl.
*H01L 25/065* (2006.01)
*H01L 23/00* (2006.01)

(52) U.S. Cl.
CPC .. *H01L 23/49551* (2013.01); *H01L 23/49575* (2013.01); *H01L 24/40* (2013.01); *H01L 25/0657* (2013.01); *H01L 27/088* (2013.01); *H01L 2224/371* (2013.01); *H01L 2224/37147* (2013.01); *H01L 2224/37599* (2013.01); *H01L 2224/40245* (2013.01); *H01L 2924/0002* (2013.01); *H01L 2924/181* (2013.01)

(58) Field of Classification Search
CPC ............. H01L 27/0629; H01L 25/0657; H01L 23/49575; H01L 2924/0002; H01L 2224/40245; H01L 2924/181
See application file for complete search history.

(56) References Cited

U.S. PATENT DOCUMENTS

| | | | | |
|---|---|---|---|---|
| 6,709,900 | B2 * | 3/2004 | Efland | H01L 21/761 257/E21.544 |
| 6,729,886 | B2 * | 5/2004 | Efland | H01L 21/761 257/E21.544 |
| 6,753,575 | B2 * | 6/2004 | Efland | H01L 21/761 257/335 |
| 6,770,935 | B2 * | 8/2004 | Efland | H01L 21/761 257/337 |
| 6,784,493 | B2 * | 8/2004 | Efland | H01L 21/761 257/347 |
| 7,443,014 | B2 * | 10/2008 | Otremba | H01L 23/49513 257/676 |
| 7,847,316 | B2 * | 12/2010 | Torii | H01L 24/05 257/133 |
| 7,898,080 | B2 * | 3/2011 | Otremba | H01L 24/40 257/685 |
| 8,148,815 | B2 * | 4/2012 | Girdhar | H01L 23/645 257/723 |
| 8,704,269 | B2 * | 4/2014 | Macheiner | H01L 23/49537 257/107 |
| 9,257,375 | B2 * | 2/2016 | Bhalla | H01L 23/3171 |
| 2003/0164545 | A1 * | 9/2003 | Nadd | H02H 7/0838 257/724 |
| 2003/0228729 | A1 * | 12/2003 | Efland | H01L 21/761 438/207 |
| 2005/0253457 | A1 * | 11/2005 | Pierret | F02N 11/04 307/10.1 |
| 2006/0169976 | A1 * | 8/2006 | Kameda | H01L 23/49575 257/44 |
| 2006/0202228 | A1 * | 9/2006 | Kanazawa | H01L 23/49575 257/177 |
| 2007/0090496 | A1 * | 4/2007 | Otremba | H01L 23/49513 257/666 |
| 2011/0181255 | A1 * | 7/2011 | Hashimoto | H02M 3/1588 323/272 |
| 2012/0119343 | A1 * | 5/2012 | Bayan | H01L 21/4842 257/676 |
| 2012/0161128 | A1 * | 6/2012 | Macheiner | H01L 23/49537 257/48 |
| 2012/0181996 | A1 | 7/2012 | Gehrke | |

FOREIGN PATENT DOCUMENTS

| | | | |
|---|---|---|---|
| JP | 2008010851 | A * | 1/2008 |
| RU | 71191 | U1 | 2/2008 |

OTHER PUBLICATIONS

Infineon Data Sheet, BTM7755G, High Current H-Bridge, Trilith IC 3G, Rev. 2.0, May 28, 2010, 24 pages.

* cited by examiner

POWER FIELD-EFFECT TRANSISTOR (FET), PRE-DRIVER, CONTROLLER, AND SENSE RESISTOR INTEGRATION FOR MULTI-PHASE POWER APPLICATIONS

This application claims the benefit of U.S. Provisional Application No. 62/090,197, filed Dec. 10, 2014, the entire content of which is incorporated herein by reference.

TECHNICAL FIELD

The disclosure relates to integrated circuits, and more particularly, to the packaging of field-effect transistor (FET) integrated circuits.

BACKGROUND

Multi-phase bridge circuits may be used in a variety of power applications, such as motor drivers and multi-phase power converters. Multi-phase bridge circuits may include full bridge circuits (H-bridges), 3-phase bridge circuits, dual bridge circuits, as well as other circuits that include two or more half-bridge configurations of transistors. In many power applications (e.g., motor drivers and power converters), there may be limited room for the power electronics in the device. For power converters, power density is a major issue. Moreover, when multiple power field-effect transistors (FETs) are used to implement power electronics, on-board parasitics may present performance limitations. In addition, multiple discrete components may need to be obtained to design a multiphase bridge circuit, thereby increasing system cost. As the number of phases or the number of voltage outputs increase in a bridge circuit the problems may get significantly worse. Designing compact, high-current density multi-phase bridge circuits that have relatively low thermal power dissipation, that are not unduly burdened by on-board parasitics, and that have low components counts may present significant design challenges.

SUMMARY

A multi-chip package includes at least two low-side (LS) field-effect transistors (FETs). The multi-chip package further includes at least two high-side (HS) FETs. The multi-chip package further includes a die including the at least two HS FETs or the at least two LS FETs.

A multi-chip package includes at least two low-side (LS) field-effect transistors (FETs). The multi-chip package further includes at least two high-side (HS) FETs. The multi-chip package further includes a first die including the at least two HS FETs or the at least two LS FETs. The multi-chip package further includes a second die including at least one of a controller circuit and a driver circuit.

A multi-chip package includes at least two low-side (LS) field-effect transistors (FETs). The multi-chip package further includes at least two high-side (HS) FETs. The multi-chip package further includes a first die including the at least two HS FETs or the at least two LS FETs. The multi-chip package further includes a second die including at least one of a controller circuit or a driver circuit. The multi-chip package further includes a first resistor coupled to a first one of the at least two HS FETs or the at least two LS FETs. The multi-chip package further includes a second resistor coupled to a second one of the at least two HS FETs or the at least two LS FETs.

DETAILED DESCRIPTION

Figure 1:
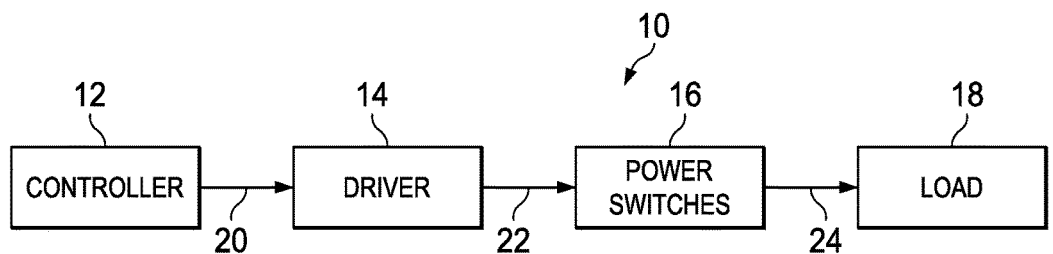
FIG. 1 is a block diagram showing an example powered system that may use a multi-chip package according to this disclosure.

This disclosure describes techniques for integrating power field-effect transistors (FETs), pre-drivers, controllers, and/or resistors into a common multi-chip package for implementing a multi-phase bridge circuit. The techniques may include providing a multi-chip package with at least two high-side (HS) FETs and at least two low-side (LS) FETs, and placing the at least two HS FETs or the at least LS FETs on a common die. Placing at least two FETs on a common die may reduce the number of die and the number of thermal pads (i.e., die pads) needed to implement a set of power FETs. In this way, the component count of a multi-chip package that supports multi-phase bridge circuits may be decreased.

Moreover, implementing the HS FETs on a common die may allow the same size of FETs to be implemented in a smaller area by eliminating die and thermal pad spacing that would otherwise be needed if the HS FETs were implemented on separate die. The extra area generated by the integration of the HS FETs may allow the size of the combined FET die to be increased, which may result in lower thermal power dissipation. In this way, a more compact, higher current density multi-phase circuit may be obtained without significantly increasing thermal power dissipation of the circuit.

In some examples, two or more HS FETs may be implemented on a common die, and the substrate of the HS FETs may act as a common drain for the HS FETs. Using a combined HS FET die with a common drain may allow multi-phase bridge circuits that share a common drain voltage to be implemented with reduced area relative to similar circuits that are implemented with separate HS FET dies.

In further examples, two or more HS FETs may be implemented on a first common die, and two or more LS FETs may be implemented on a second common die. The substrate of the HS FETs may act as a common drain for the HS FETs, and the substrate of the LS FETs may act as a common source for the LS FETs. Using combined FET dies for both the LS and HS FETs may allow multi-phase bridge circuits that share a common drain and source voltage and that do not include LS sense resistors to be implemented with reduced area relative to similar circuits that are implemented with separate HS and LS FET dies.

In some examples, when the common source of the LS FETs is coupled to a ground supply voltage, the controller and/or pre-driver dies may be able to be implemented on the same thermal pad as the LS FETs. This may further reduce the component count of the multi-chip package as well as further reduce the amount of area consumed.

In additional examples, two or more LS FETs may be implemented on a common die, and two or more HS FETs may be stacked on top of the common LS FET die to generate a vertically-stacked FET die structure. The substrate of the LS FETs may act as a common source for the LS FETs. Stacking the HS die on top of the combined LS FET die may reduce the amount of area taken up by LS and HS FETs in a multi-chip package. The extra area generated by the stacking of the HS FETs on the combined LS FET die may allow the size of the combined LS FET die to be increased, which may result in lower current density and lower thermal power dissipation. In this way, a more compact power circuit may be obtained without significantly increasing thermal power dissipation of the circuit.

In additional examples, two or more LS FETs may be implemented on a common die, two or more HS FETs may be stacked on top of the common LS FET die to generate a vertically-stacked FET die structure, and one or more sense resistors may be coupled to one or more of the HS FETs. The substrate of the LS FETs may act as a common source for the LS FETs. Coupling the sense resistors to HS FETs instead of the LS FETs may allow a controller and/or pre-driver die to be implemented on the same thermal pad as the combined LS FET die. This may further reduce the component count of the multi-chip package as well as further reduce the amount of area consumed.

In some examples, a multi-chip package designed according to this disclosure may include, in addition to, at least two HS FETs and at least two LS FETs, a controller and/or pre-driver. In further examples, a multi-chip package designed according to this disclosure may include at least two HS FETs, at least two LS FETs, a controller and/or pre-driver, and one or more sense resistors.

The techniques of this disclosure may allow the component counts of multi-chip packages that implement multi-phase bridge circuits to be reduced. The techniques may further allow customers to obtain a single multi-chip package solution from a single vender for implementing multi-phase bridge circuits. The techniques may also reduce on board parasitics, which may be a performance limitation for power circuits, such as motor drivers and power converters.

FIG. 1 is a block diagram showing an example powered system 10 that may use a multi-chip package according to this disclosure. Powered system 10 includes a controller 12, a driver 14, power switches 16, a load 18 and connections 20, 22, 24. Controller 12 and driver 14 may be alternatively referred to as a controller circuit and a driver circuity, respectively.

An output of controller 12 is coupled to an input of driver 14 via connection 20. An output of driver 14 is coupled to an input of power switches 16 via connection 22. An output of power switches 16 is coupled to an input of load 18 via connection 24.

Power switches 16 may include one or more high-side (HS) power switches and one or more low-side (LS) power switches. Respective LS power switches may be coupled to respective HS power switches to form a multi-phase bridge circuit. Driver 14 may include one or more drivers configured to provide sufficient current and/or voltage to drive the gates of power switches 16. Controller 12 may generate control signals that control the operation of power switches 16 (e.g., determine when power switches 16 switch, turn on, and/or turn off). In some examples, controller 12 may be a pulse width modulation (PWM) controller, and generate PWM pulses that control power switches 16. Load 18 may be any component that is driven by power switches 16 and/or that is powered by the output of power switches 16. For example, load 18 may be a motor or inductors in a power converter that is driven by power switches 16.

In some examples, controller 12 may receive feedback from one or more of driver 14, power switches 16, and load 18 via one or more connections (not shown), and controller 12 may control the operation of power switches 16 based on the feedback. For example, power switches 16 may include one or more current sense resistors, and controller 12 may receive feedback information indicative of the voltage across the current sense resistors and/or feedback information indicative of an amount of current flowing through the current sense resistors, which may be indicative of the amount of current flowing through the bridge circuit in power switches 16.

Figure 2:
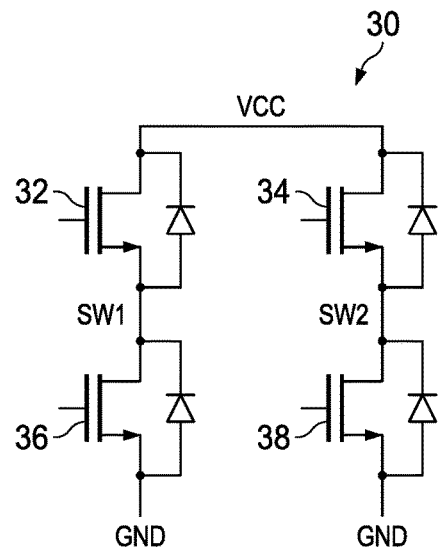
FIG. 2 is a schematic diagram of an example full-bridge circuit (or H-bridge circuit) according to this disclosure.

FIG. 2 is a schematic diagram of an example full-bridge circuit 30 (or H-bridge circuit) according to this disclosure. Full-bridge circuit 30 includes high-side (HS) FETs 32, 34 and low-side (LS) FETs 36, 38. A source electrode of HS FET 32 is coupled to a drain electrode of LS FET 36 forming a half-bridge configuration (or totem-pole configuration). A source electrode of HS FET 34 is coupled to a drain electrode of LS FET 38 forming another half-bridge configuration.

In some examples, drain electrodes of HS FETs 32, 34 may be coupled to each other and to a high power supply voltage (VCC) and/or input voltage. In further examples, the drain electrodes of HS FETs 32, 34 may each be coupled to a respective current sensing resistor.

In some examples, source electrodes of LS FETs 36, 38 may be coupled to each other and to a low power supply voltage (e.g., a ground voltage (GND)). In further examples, the source electrodes of LS FETs 36, 38 may each be coupled to a respective current sensing resistor.

Gate electrodes of each of FETs 32, 34, 36, 38 may be coupled to outputs of respective gate driver circuits (e.g., gate driver circuits included in driver 14 of FIG. 1), which are in turn coupled to a controller (e.g., controller 12 in FIG. 1). Thus, the gate electrodes of FETs 32, 34, 36, 38 may be effectively coupled to a controller (e.g., a PWM controller).

The source electrode of HS FET 32 and the drain electrode of LS FET 36 may form a first output (SW1) for full-bridge circuit 30. The source electrode of HS FET 34 and the drain electrode of LS FET 38 may form a first output (SW2) for full-bridge circuit 30.

FETs 32, 34, 36, 38 may be power FET transistors. In some examples, one of the current conduction terminals (i.e., source or drain terminals) of one or more of FETs 32, 34, 36, 38 may be formed by the substrate (e.g., bulk substrate) of the transistor, and the other of the current conduction terminals may be formed on the top semiconductor surface of the transistor. In cases where the substrate forms the drain terminal of the transistor, the transistor may be referred to herein as a "drain substrate" transistor or a "drain down" transistor. In cases where the substrate forms the source terminal of the transistor, the transistor may be referred to herein as a "source substrate" transistor or a "source down" transistor.

In further examples, one or more of FETs 32, 34, 36, 38 may allow current to flow vertically between at least a portion of the top semiconductor surface and a substrate of the transistor. Vertical current flow may refer to current that flows in a direction that is substantially perpendicular to a planar surface of the semiconductor substrate. Transistors that allow vertical current flow and/or transistors that use the substrate as a current conduction terminal may be referred to herein as vertical transistors or vertical power transistors. In additional examples, one or more of FETs 32, 34, 36, 38 may include a lightly-doped drain (LDD) region.

Figure 3:
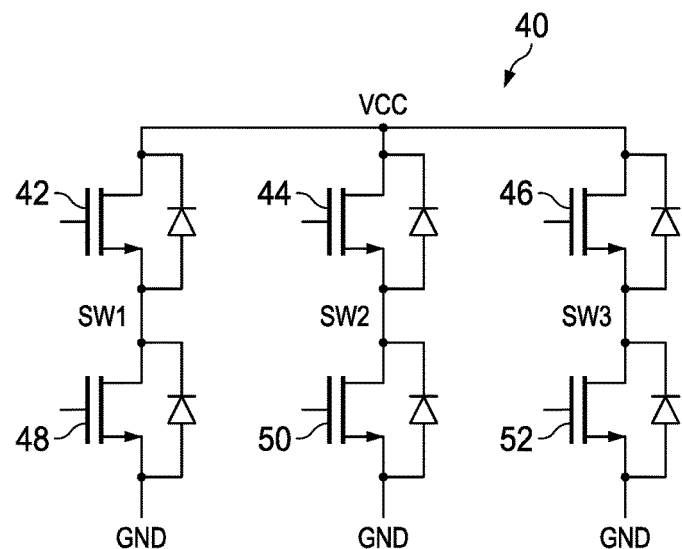
FIG. 3 is a schematic diagram of an example three-phrase bridge circuit according to this disclosure.

FIG. 3 is a schematic diagram of an example three-phase bridge circuit 40 according to this disclosure. Three-phase bridge circuit 40 includes HS FETs 42, 44, 46 and LS FETs 48, 50, 52. Three-phase bridge circuit 40 is similar to full-bridge circuit 30 in FIG. 2 except that three-phase bridge circuit 40 includes three half-bridge transistor configurations instead of two, and three outputs (SW1, SW2, SW3) instead of two. Although FIG. 3 illustrates the drain terminals of HS FETs 42, 44, 46 as being directly coupled to each other and to a common high supply voltage (VCC), in other examples, the drain terminals of HS FETs 42, 44, 46 may not be directly coupled to each other. For example, the drain terminals of HS FETs 42, 44, 46 may be separately coupled to respective sense resistors (i.e., current sensing resistors). Similarly, in additional examples, the source terminals of LS FETs 48, 50, 52 may be separately coupled to respective sense resistors.

Figure 4:
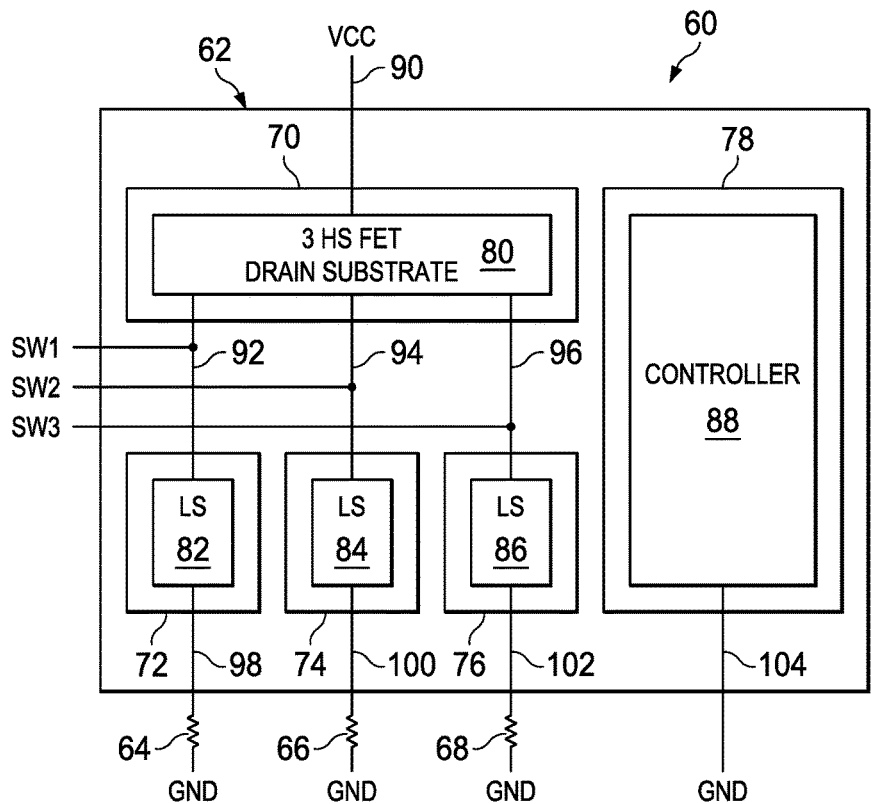
FIGS. 4-7 are conceptual diagrams of example multi-chip packages that include various example bridge configuration circuits according to this disclosure.

FIG. 4 is a conceptual diagram of an example system 60 that includes an example three-phase bridge circuit according to this disclosure. System 60 includes a multi-chip package 62 and sense resistors 64, 66, 68. Multi-chip package 62 may implement a three-phase bridge circuit with LS current sensing capability.

Multi-chip package 62 includes thermal pads 70, 72, 74, 76, 78, a combined HS FET die 80, LS FET dies 82, 84, 86, a controller die 88, and conductors 90, 92, 94, 96, 98, 100, 102, 104. Combined HS FET die 80 is disposed on thermal pad 70. Multi-chip package 62 may further include a lead frame upon which thermal pads 70, 72, 74, 76, 78 are formed. In some examples, thermal pads 70, 72, 74, 76, 78 may be exposed to an external surface of multi-chip package 62.

Combined HS FET die 80 is placed on top of thermal pad 70 such that a substrate of combined HS FET die 80 is directly connected to, electrically coupled to, and/or thermally coupled to thermal pad 70. LS FET dies 82, 84, 86 are placed on top of thermal pads 72, 74, 76, respectively, such that respective substrates of LS FET dies 82, 84, 86 are directly connected to, electrically coupled to, and/or thermally coupled to respective thermal pads 72, 74, 76. Controller die 88 is placed on top of thermal pad 78 such that a substrate of controller die 88 is directly connected to, electrically coupled to, and/or thermally coupled to thermal pad 78.

Combined HS FET die 80 is a single die that includes three different HS FETs that share a common substrate. The common substrate acts a common drain for the FETs. As such, the FETs included in combined HS FET die 80 may be referred to as "drain substrate" FETs or "drain down" FETs. In some examples, a drain electrode may be formed on the substrate of combined HS FET die 80 (e.g., on a back side of combined HS FET die 80), and the drain electrode may be mechanically, thermally, and/or electrically coupled to thermal pad 70. In further examples, thermal pad 70 may be directly connected to the substrate of combined HS FET die 80, thereby forming the drain electrode of combined HS FET die 80.

Combined HS FET die 80 may have three source electrodes, each of which corresponds to a source electrode for a respective one of the three different FETs included in combined HS FET die 80. The source electrodes may be electrically isolated from each other on the die. In some examples, a first planar surface of combined HS FET die 80 (which may be a substrate surface of combined HS FET die 80) may be placed on thermal pad 70, and the three source electrodes may be formed on a second planar surface of combined HS FET die 80 that is opposite the first planar surface. In further examples, metallization for each of the source electrodes may be formed on the second planar surface of combined HS FET die 80, and the metallization for each of the source electrodes may be formed on top of and wrap at least partially around a respective gate electrode for each of the FETs.

LS FET dies 82, 84, 86 may include drain substrate FETs (i.e., where the substrate of each of FETs acts a drain terminal of the respective FET) or source substrate FETs (where the substrate of each of the FETs acts a source terminal of the respective FET). In some examples, respective source or drain electrodes may be formed on the substrates of LS FET dies 82, 84, 86, and the source or drain electrodes may be mechanically, thermally, and/or electrically coupled to respective thermal pads 72, 74, 76. In further examples, respective thermal pads 72, 74, 76 may be directly connected to respective substrates of LS FET dies 82, 84, 86, thereby forming respective source or drain electrodes for LS FET dies 82, 84, 86. LS FET dies 82, 84, 86 may each have a respective source terminal. In some examples, respective source terminals may be formed on respective planar surfaces of LS FET dies 82, 84, 86 that are opposite of respective planar surfaces of LS FET dies 82, 84, 86 that are placed on respective thermal pads 72, 74, 76.

Respective drain electrodes of LS FET dies 82, 84, 86 are coupled to respective source electrodes of combined HS FET die 80 via conductors 92, 94, 96, respectively. Conductors 92, 94, 96 are coupled to respective output terminals (SW1, SW2, SW3) of multi-chip package 62. Conductor 90 is coupled between a high voltage supply (VCC) terminal of multi-chip package 62 and one or both of a drain electrode of combined HS FET die 80 and thermal pad 70. The drain terminal of combined HS FET die is electrically coupled to thermal pad 70.

Conductors 98, 100, 102 are coupled between respective source electrodes of LS FET dies 82, 84, 86 and respective sense resistor terminals (or low voltage supply terminals) of multi-chip package 62. Respective first terminals of each of sense resistors 64, 66, 68 are coupled to respective sense resistor terminals of multi-chip package 62 (and consequently coupled to respective source terminals of controller die 88). Respective second terminals of each of sense resistors 64, 66, 68 are coupled to a low supply voltage (GND).

Controller die 88 may include one or both of a controller and gate drivers (e.g., one or both of controller 12 and driver 14 in FIG. 1). Conductor 104 is coupled between a low voltage supply input of controller die 88 and a low voltage supply terminal of multi-chip package 62.

Gate electrodes for each of the HS FETs included in combined HS FET die 80 and for each of LS FET dies 82, 84, 86 may be coupled to controller die 88 via one or more conductors (not shown) and/or to one or more terminals of multi-chip package 62.

As shown in FIG. 4, the HS FETs are combined into a common die. Drain substrate FETs may be used for combining the HS FETs into a single die because the drains of the HS FETs may be connected together to a single supply (VCC). Combining the HS FETs into a single die may allow the number of thermal pads to be reduced, thereby providing a more cost effective, area efficient and thermally efficient package for a multi-phase bridge circuit. For example, multi-chip package 62 in FIG. 4 may use five thermal pads, which is two pads less than what would otherwise be needed if the three HS FETs were implemented on separate die and separate thermal pads.

For a given size of HS FET, combining the HS FETs into a single die may increase the power density in multi-chip package 62, thereby making thermal dissipation a problem. Thermal issues may be alleviated or reduced by increasing the FET size. The FET size may be increased because there is more space available when the FETs are combined and some of the savings in packaging cost can be allocated to increasing the size of the FETS. When the FET size is increased, the corresponding on-resistance of the FETs may be reduced. Reducing the on-resistance of the FETs may reduce the power dissipation, thereby reducing thermal dissipation issues. In this way, a more compact, cost effective, and area efficient multi-phase bridge circuit may be obtained.

Figure 5:
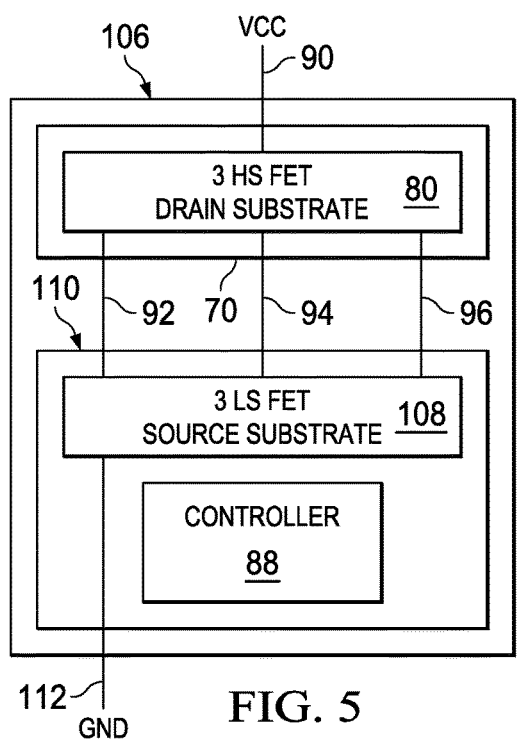

FIG. 5 is a conceptual diagram of another example multi-chip package 106 according to this disclosure. Multi-chip package 106 may implement a three-phase bridge circuit without LS or HS current sense resistors. Multi-chip package 106 is similar to multi-chip package 62 in FIG. 4 except that: (a) LS FET dies 82, 84, 86 have been combined into a single combined LS FET die 108 and placed on a single thermal pad 110; (b) controller die 88 has been placed on a common thermal pad 110 with combined LS FET die 108; and (c) a single conductor 112 is coupled between source electrodes of the LS FETs on combined LS FET die 108 and a low supply voltage terminal of multi-chip package 106.

Combined LS FET die 108 is a single die that includes three different LS FETs that share a common substrate, which acts a common source terminal for the FETs. As such, the FETs on combined LS FET die 108 may be referred to as "source substrate" FETs or "source down" FETs. In some examples, a source electrode may be formed on the substrate of combined LS FET die 108 (e.g., on a back side of combined LS FET die 108), and the source electrode may be mechanically, thermally, and/or electrically coupled to thermal pad 110. In further examples, thermal pad 110 may be directly connected to the substrate of combined LS FET die 108, thereby forming the source electrode of combined LS FET die 108.

Combined LS FET die 108 may have three drain electrodes, each of which corresponds to a drain electrode for a respective one of the three different FETs included in combined LS FET die 108. The drain electrodes may be electrically isolated from each other on the die. In some examples, a first planar surface of combined LS FET die 108 (which may be a substrate surface of combined LS FET die 108) may be placed on thermal pad 110, and the three drain electrodes may be formed on a second planar surface of combined LS FET die 108 that is opposite the first planar surface. In further examples, metallization for each of the drain electrodes may be formed on the second planar surface of combined LS FET die 108, and the metallization for each of the drain electrodes may be formed on top of and wrap at least partially around a respective gate electrode for each of the FETs.

Conductors 92, 94, 96 are coupled between respective drain electrodes of combined LS FET die 108, respective source electrodes of combined HS FET die 80, and respective output terminals (SW1, SW2, SW3) of multi-chip package 106. Conductor 112 is coupled to a source electrode of combined LS FET die 108, a ground input of controller die 88, thermal pad 110, and a low voltage supply terminal of combined LS FET die 108.

In FIG. 4, the LS FETs were not combined because the output terminals and the sense resistors caused the source and drain terminals of the LS FETs to be at different potentials. However, in FIG. 5, no sense resistors are used on the low side. As such, source substrate FETs may be used to implement the LS FETs. This may allow the LS FETs to be combined into a single die and further allow the sources to be connected together and to a common ground potential (GND). This may allow all of the LS FET and pre-driver substrates to be implemented on a common thermal and pad and be connected to the ground potential. This may further reduce the number of pads, and provide further improvements in cost, area, and thermal efficiency.

Figure 6:
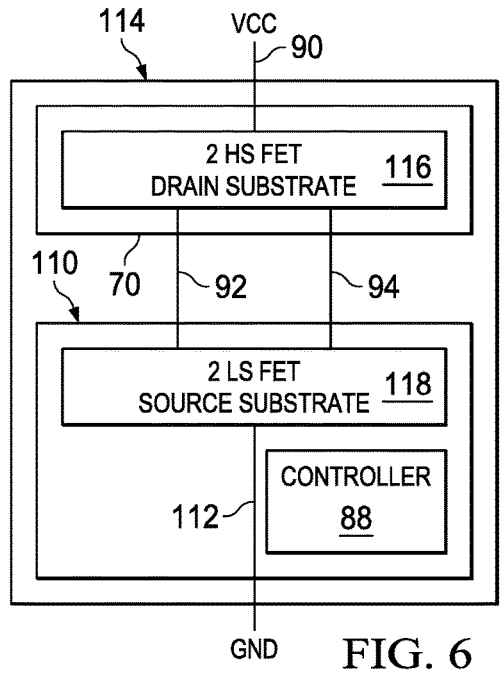

FIG. 6 is a conceptual diagram of an example multi-chip package 114 according to this disclosure. Multi-chip package 114 may implement a full bridge circuit without LS or HS current sense resistors. Multi-chip package 114 is similar to multi-chip package 106 in FIG. 5 except that: (a) combined HS FET die 80 has been replaced by combined HS FET die 116; (b) combined LS FET die 108 has been replaced by combined LS FET die 118; and (c) conductor 96 has been omitted.

Combined HS FET die 116 is similar to combined HS FET die 80 in FIG. 5 except that combined HS FET die 116 includes two HS FETs instead of three HS FETs. Combined LS FET die 118 is similar to combined LS FET die 108 in FIG. 5 except that combined LS FET die 118 includes two LS FETs instead of three LS FETs. The two HS FETs in combined HS FET die 116 are drain substrate FETs, and the two LS FETs in combined LS FET die 118 are source substrate LS FETs. Respective conductors 92, 94 are coupled between respective drain terminals of combined LS FET die 118, respective source terminals of combined HS FET die 116, and respective output terminals (SW1, SW2) of multi-chip package 114.

Figure 7:
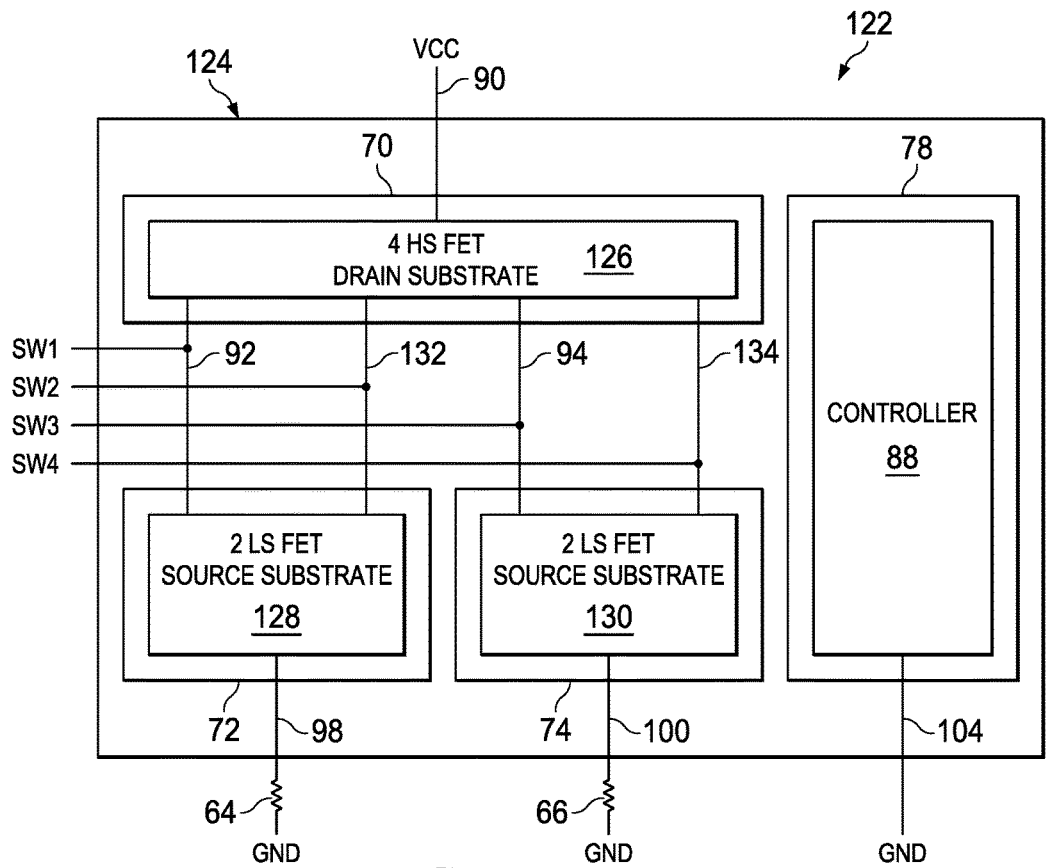

FIG. 7 is a conceptual diagram of an example system 122 according to this disclosure. System 122 includes a multi-chip package 124 and sense resistors 64, 66. System 122 may implement a dual bridge circuit with LS current sense resistors. The dual bridge circuit may be suitable for controlling a stepper motor. Multi-chip package 124 is similar to multi-chip package 62 in FIG. 4 except that: (a) combined HS FET die 80 has been replaced by combined HS FET die 126; (b) LS FET dies 82, 84 have been replaced by combined LS FET dies 128, 130, respectively; (c) conductors 132, 134 have been added; and (d) thermal pad 76 and LS FET die 86 have been omitted.

Combined HS FET die 126 is similar to combined HS FET die 80 in FIG. 4 except that combined HS FET die 126 includes four HS FETs instead of three HS FETs. Combined LS FET dies 128, 130 are each similar to combined LS FET die 118 shown in FIG. 6. The four HS FETs in combined HS FET die 126 are drain substrate FETs, and the two LS FETs in each of combined LS FET dies 128, 130 are source substrate LS FETs.

Respective conductors 92, 132 are coupled between respective drain terminals of combined LS FET die 128, respective source terminals of combined HS FET die 126, and respective output terminals of multi-chip package 124. Respective conductors 94, 134 are coupled between respective drain terminals of combined LS FET die 130, respective source terminals of combined HS FET die 126, and respective output terminals of multi-chip package 124.

Figure 8:
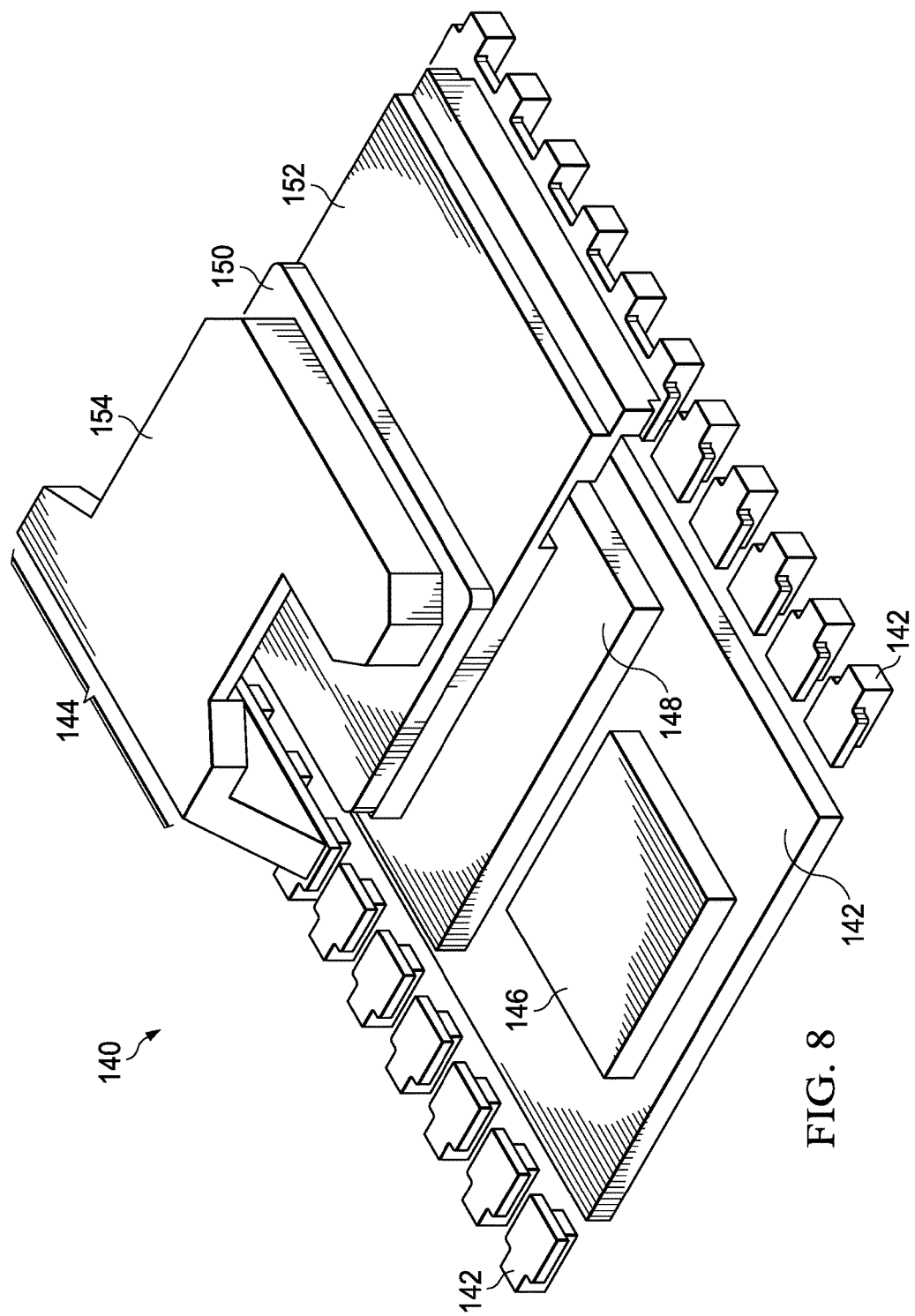
FIG. 8 is a perspective view of an example multi-chip package that includes a vertically-stacked FET die structure according to this disclosure.

FIG. 8 is a perspective view of an example multi-chip package 140 according to this disclosure. Multi-chip package 140 includes a vertically-stacked FET die structure 144 and a controller die 146. Vertically-stacked FET die structure 144 includes a LS FET die 148, a HS FET die 150, a central clip 152, and an upper clip 154. Vertically-stacked FET die structure 144 and controller die 146 are both disposed on, attached to, mechanically coupled to, electrically coupled to, and/or thermally coupled to a thermal pad (not shown), which is disposed on lead frame 142. A contact formed on the substrate of LS FET die 148 may be electrically coupled to and/or thermally coupled to the thermal pad. A current conduction electrode (e.g., source or drain electrode) of LS FET die 148 is coupled to central clip 152. Central clip 152 may mechanically hold LS FET die 148 in place within vertically-stacked FET die structure 144. A first portion of central clip 152 may extend laterally across a planar surface of LS FET die 148, and a second portion of central clip 152 may extend vertically and/or diagonally toward a first set of one or more terminals of lead frame 142.

HS FET die 150 may be placed on top of central clip 152 such HS FET die 150 may be said to be vertically stacked on top of LS FET die 148 and/or central clip 152. Upper clip 154 may mechanically hold HS FET die 150 in place within vertically-stacked FET die structure 144. A contact formed on the substrate of HS FET die 150 may be electrically coupled to and/or thermally coupled to upper clip 154. A current conduction electrode (e.g., source or drain electrode) of HS FET die 150 is coupled to central clip 152. A first portion of upper clip 154 may extend laterally across a planar surface of HS FET die 150, and a second portion of upper clip 154 may extend vertically and/or diagonally toward a second set of one or more terminals of lead frame 142.

Clips 152, 154 may be made of a conductor, such as, copper or a manganine alloy. Clips 152, 154 may be alternatively referred to as tap clips.

Figure 9:
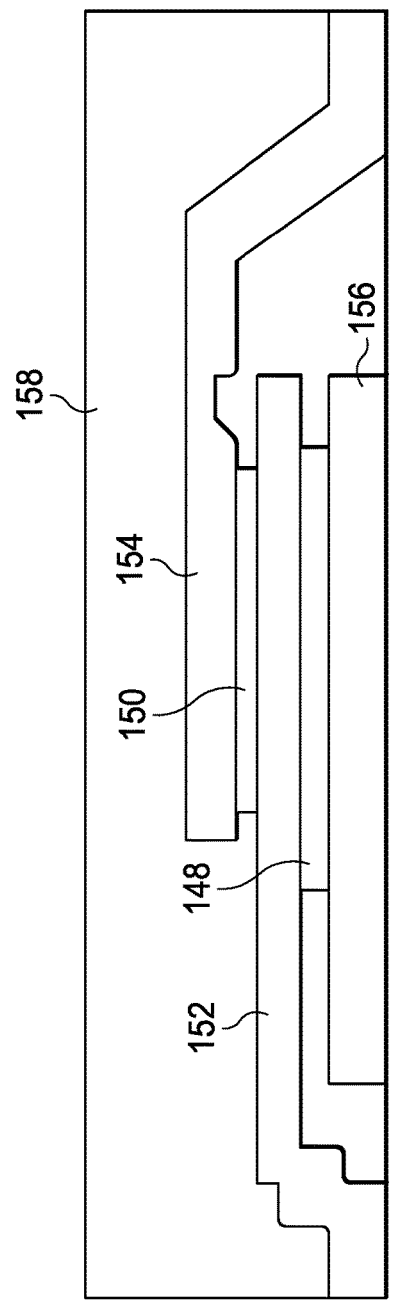
FIG. 9 is a cross-sectional view of the example multi-chip package of FIG. 8.

FIG. 9 is a cross-sectional view of the example multi-chip package 140 of FIG. 8 at a plane crossing vertically-stacked FET die structure 144. FIG. 9 illustrates a thermal pad 156 (not shown in FIG. 8) that may be disposed on a lower planar surface of multi-chip package 140. In some examples, thermal pad 156 may be exposed to an exterior surface of multi-chip package 140. FIG. 9 also illustrates a molding material 158 (not shown in FIG. 8) that may be used for packing multi-chip package 140.

As shown in FIG. 9, LS FET die 148 is placed between thermal pad 156 and central clip 152, and HS FET die 150 is placed between central clip 152 and upper clip 154. In general, vertically-stacked FET die structure 144 may include a plurality of levels and layers. For example, thermal pad 156 may form a bottom layer (or level) of vertically-stacked FET die structure 144, LS FET die 148 may form a lower die layer of vertically-stacked FET die structure 144, central clip 152 may form a lower or central clip layer, HS FET die 150 may form an upper die layer, and upper clip 154 may form an upper clip layer. In some cases, controller die 146 may also be considered part of the lower die layer of vertically-stacked FET die structure 144. Some of the embodiments in this disclosure may use multiple die and/or multiple clips per layer in a vertically-stacked FET die structure.

Figure 10:
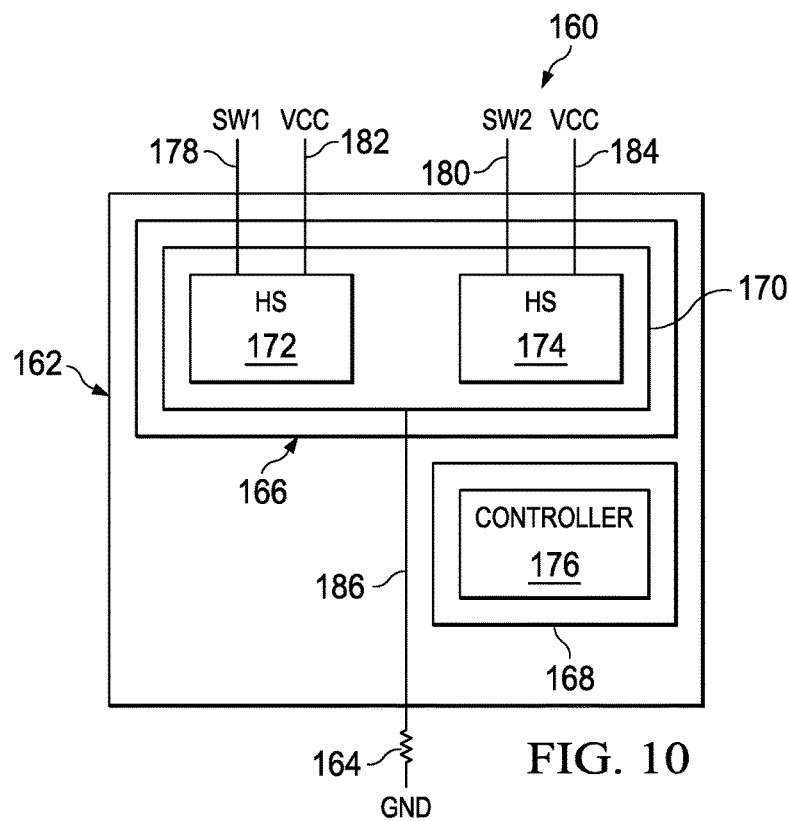
FIGS. 10-34 are conceptual diagrams of additional example multi-chip packages that include various example bridge circuits according to this disclosure.

FIG. 10 is a conceptual diagram of an example system 160 according to this disclosure. System 160 includes a multi-chip package 162 and a sense resistor 164. System 160 may implement a full bridge circuit with LS current sensing. System 160 includes thermal pads 166, 168, a combined LS FET die 170, HS FET dies 172, 174, a controller die 176, and conductors 178, 180, 182, 184, 186. System 160 may further include a lead frame upon which thermal pads 166, 168 are formed. In some examples, thermal pads 166, 168 may be exposed to an external surface of multi-chip package 162.

Combined LS FET die 170 is placed on top of thermal pad 166 such that a substrate of combined LS FET die 170 is directly connected to, electrically coupled to, and/or thermally coupled to thermal pad 166, HS FET dies 172, 174 are stacked on top of combined LS FET die 170. Controller die 176 is placed on top of thermal pad 168 such that a substrate of controller die 176 is directly connected to, electrically coupled to, and/or thermally coupled to thermal pad 168.

Combined LS FET die 170 is similar to combined LS FET die 118 in FIG. 6. Combined LS FET die 170 may include two source substrate LS FETs. HS FET dies 172, 174 are similar to FET dies 82, 84, 86 in FIG. 4 except that HS FET dies are configured to operate as high-side FETs. HS FET dies 172, 174 may be drain substrate HS FETs or source substrate HS FETs. Controller die 176 is similar to controller die 88 in FIG. 4.

Conductor 178 is coupled between one of the drain electrodes of combined LS FET die 170, a source electrode of HS FET die 172, and a first output (SW1) of multi-chip package 162. Conductor 180 is coupled between one of the drain electrodes of combined LS FET die 170, a source electrode of HS FET die 174, and a second output (SW2) of multi-chip package 162. Respective conductors 182, 184 are coupled between respective drain electrodes of HS FET dies 172, 174 and respective high supply voltage terminals of multi-chip package 162.

Sense resistor 164 is coupled between a low supply voltage terminal of multi-chip package 162 and a low supply voltage (GND). Conductor 186 is coupled between a source terminal of combined LS FET die 170, thermal pad 166, and a sense resistor (or low supply voltage terminal) of multi-chip package 162.

FET dies 170, 172, 174 may form a vertically-stacked FET die structure where combined LS FET die 170 forms a lower die layer of the structure, and HS FET dies 172, 174 form an upper layer of the structure. Two central layer clips may be disposed between the lower and upper layers of the structure. The two central layer clips may mechanically hold combined LS FET die 170 in place on thermal pad 166. The two central layer clips may correspond to conductors 178, 180, respectively. In other words, each of the clips may form a respective output (SW1, SW2) of multi-chip package 162.

As shown in FIG. 10, the LS and HS FETs may be stacked with a clip in between the FETs. The clips may implement respective switch nodes. Multiple LS source substrate FETs may be combined into a common die to make the die bigger and reduce thermal issues. Then, drain substrate HS FETs may be stacked on top of the combined LS FET die, thereby achieving a compact, cost effective thermal pad solution. In FIG. 10, two thermal pads may be used because the LS die substrate may not be at ground due to sense resistor being at the bottom. The LS die substrate may use its own pad and pre-driver pad can be connected to ground.

Figure 11:
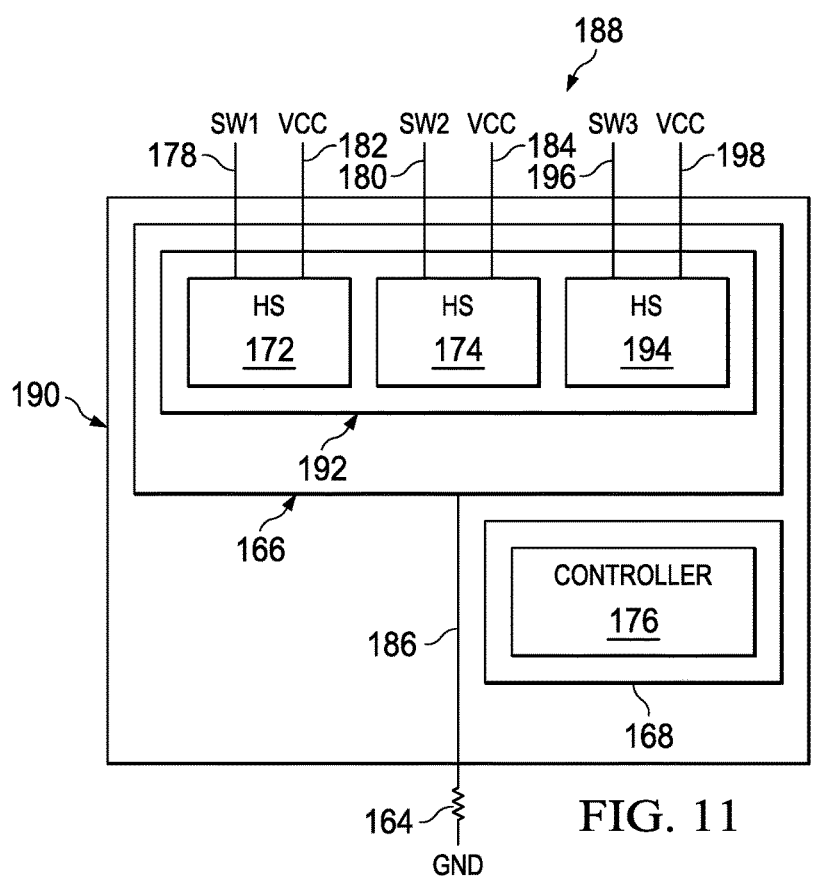

FIG. 11 is a conceptual diagram of an example system 188 according to this disclosure. System 188 may implement a three-phase bridge circuit with LS current sensing. System 188 includes a multi-chip package 190 and a sense resistor 164. Multi-chip package 190 is similar to multi-chip package 162 in FIG. 10 except that: (a) combined LS FET die 170 has been replaced by combined LS FET die 192; (b) an additional HS FET die 194 has been stacked on top of the combined LS FET die 192; (c) and additional conductors 196, 198 are included to accommodate the additional FETs.

Combined LS FET die 192 is similar to combined LS FET die 170 in FIG. 10 except that combined LS FET die 192 includes three LS FETs instead of two LS FETs. HS FET die 194 is similar to HS FET dies 172, 174. The three LS FETs in combined LS FET die 192 are source substrate LS FETs. HS FET dies 172, 174, 194 may each include either source substrate or drain substrate HS FETs.

Conductor 196 is coupled between one of the drain electrodes of combined LS FET die 192, a source electrode of HS FET die 194, and a third output (SW3) of multi-chip package 190. Conductor 198 is coupled between a drain electrode of HS FET die 194 and a high supply voltage terminal of multi-chip package 190.

FET dies 172, 174, 192, 194 may form a vertically-stacked FET die structure where combined LS FET die 192 forms a lower die layer of the structure, and HS FET dies 172, 174, 194 form an upper layer of the structure. Three central layer clips may be disposed between the lower and upper layers of the structure. The three central layer clips may mechanically hold HS FET dies 172, 174, 194 in place on thermal pad 166. The three central layer clips may correspond to conductors 178, 180, 196, respectively. In other words, each of the clips may form a respective output (SW1, SW2, SW3) of multi-chip package 190.

Figure 12:
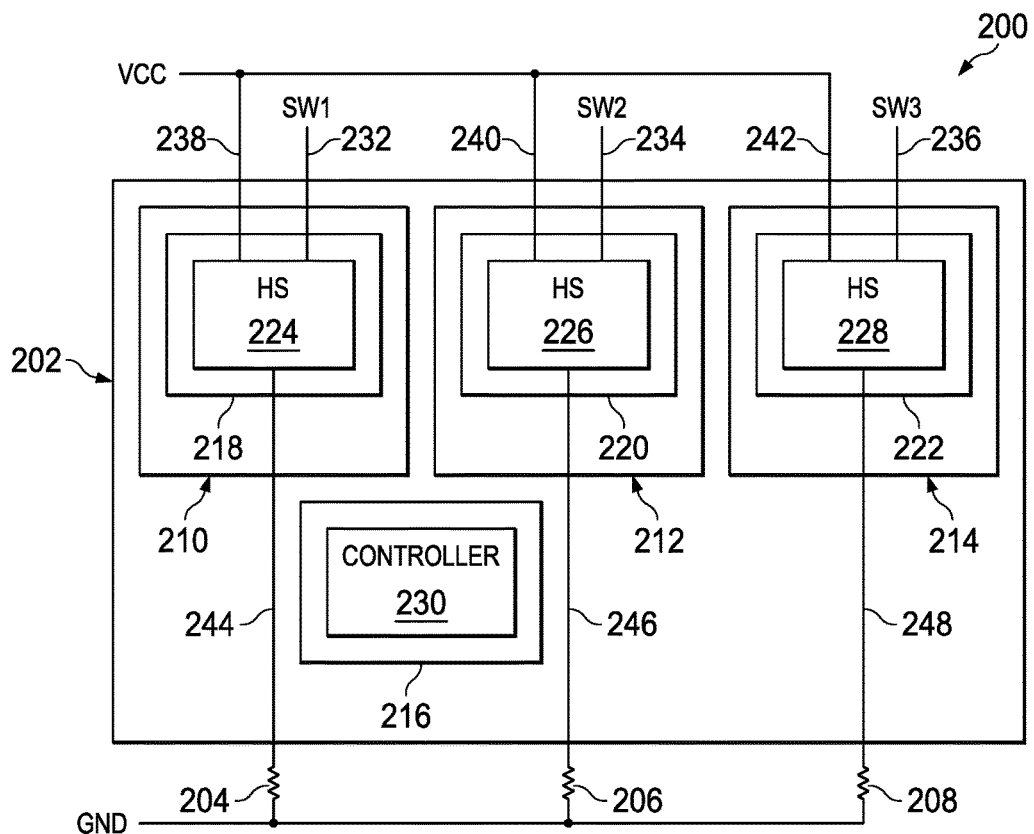

FIG. 12 is a conceptual diagram of an example system 200 according to this disclosure. System 200 may implement a three-phase bridge circuit with LS current sensing for each of the phases. System 200 includes a multi-chip package 202 and sense resistors 204, 206, 208. Multi-chip package 202 includes thermal pads 210, 212, 214, 216, LS FET dies 218, 220, 222, HS FET dies 224, 226, 228, a controller die 230, and conductors 232, 234, 236, 238, 240, 242, 244, 246, 248. Multi-chip package 202 may further include a lead frame upon which thermal pads 210, 212, 214, 216 are formed. In some examples, thermal pads 210, 212, 214, 216 may be exposed to an external surface of multi-chip package 202.

Respective LS FET dies 218, 220, 222 are placed on top of respective thermal pads 210, 212, 214 such that respective substrates of LS FET dies 218, 220, 222 are directly connected to, electrically coupled to, and/or thermally coupled to thermal pads 210, 212, 214. Respective HS FET dies 224, 226, 228 are stacked on top of respective LS FET dies 218, 220, 222. Controller die 230 is placed on top of thermal pad 216 such that a substrate of controller die 230 is directly connected to, electrically coupled to, and/or thermally coupled to thermal pad 216.

LS FET dies 218, 220, 222 are similar to LS FET dies 82, 84, 86 in FIG. 4. HS FET dies 224, 226, 228 are similar to HS FET dies 172, 174, 194 in FIG. 10. LS FET dies 218, 220, 222 and HS FET dies 224, 226, 228 may include drain substrate FETs or source substrate FETs. Controller die 176 is similar to controller die 88 in FIG. 4.

Respective conductors 232, 234, 236 are coupled between respective drain electrodes of LS FET dies 218, 220, 222, respective source electrodes of HS FET dies 224, 226, 228, and respective outputs terminals (SW1, SW2, SW3) of multi-chip package 202. Respective conductors 238, 240, 242 are coupled between respective drain terminals of HS FET dies 224, 226, 228 and one or more high supply voltage terminals of multi-chip package 202. Respective conductors 244, 246, 248 are coupled between respective source terminals of LS FET dies 218, 220, 222 and respective LS sense resistor terminals of multi-chip package 202.

Respective first terminals of sense resistors 204, 206, 208 are coupled to respective sense resistor terminals of multi-chip package 202 (and consequently respective source terminals of LS FET dies 218, 220, 222). Respective second terminals of sense resistors 204, 206, 208 are coupled to a low supply voltage (e.g., ground (GND)).

FET dies 218, 220, 222, 224, 226, 228 may form a vertically-stacked FET die structure where LS FET dies 218, 220, 222 form a lower die layer of the structure, and HS FET dies 224, 226, 228 form an upper layer of the structure. Three central layer clips may be disposed between the lower and upper layers of the structure. The three central layer clips may mechanically hold LS FET dies 218, 220, 222 in place on thermal pads 210, 212, 214, respectively. The three central layer clips may correspond to conductors 232, 234, 236, respectively. In some examples, each of the stacked LS and HS FET die pairs may form a separate vertically-stacked FET die structure.

Figure 13:
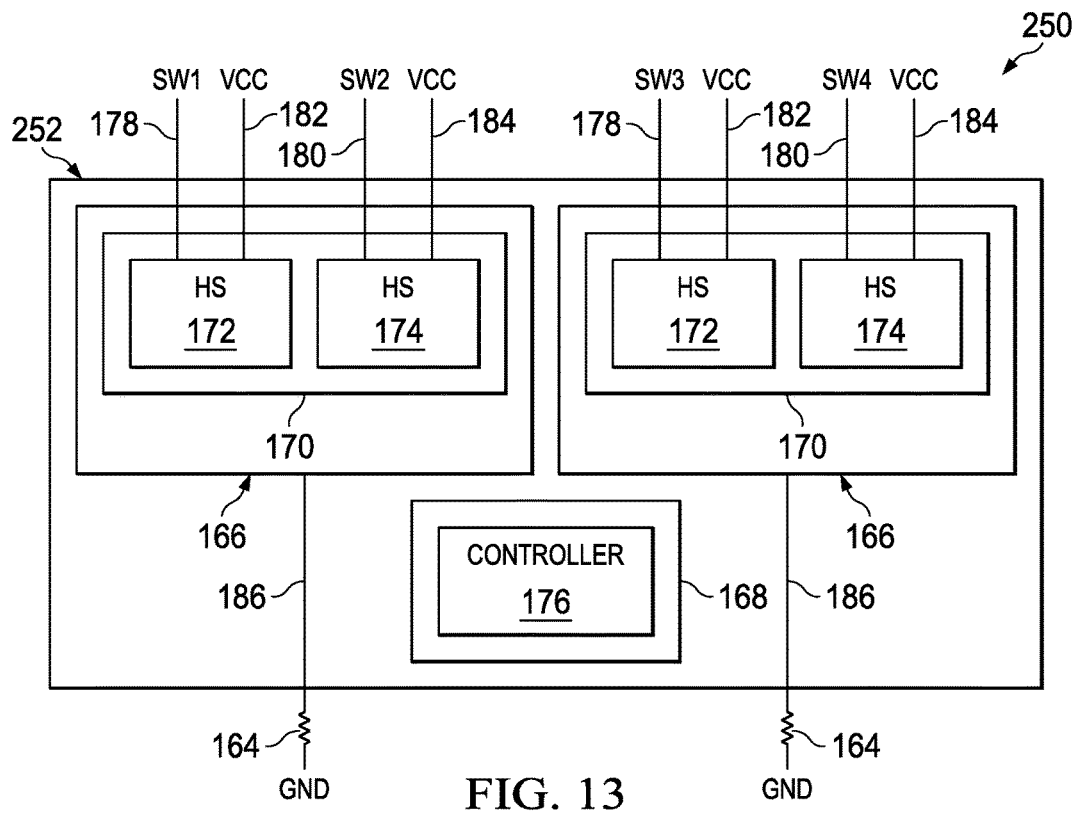

FIG. 13 is a conceptual diagram of an example system 250 according to this disclosure. System 250 may implement a dual bridge circuit with LS current sensing. System 250 is similar to system 160 in FIG. 10 except that: (a) multi-chip package 162 has been replaced by multi-chip package 252; and (b) a second sense resistor 164 has been added. Multi-chip package 252 in FIG. 13 are similar to multi-chip package 162 in FIG. 10 except that: (a) a second vertically-stacked FET die structure has been added. The second vertically-stacked FET die structure is substantially similar to the vertically-stacked FET die structure shown in FIG. 10.

Figure 14:
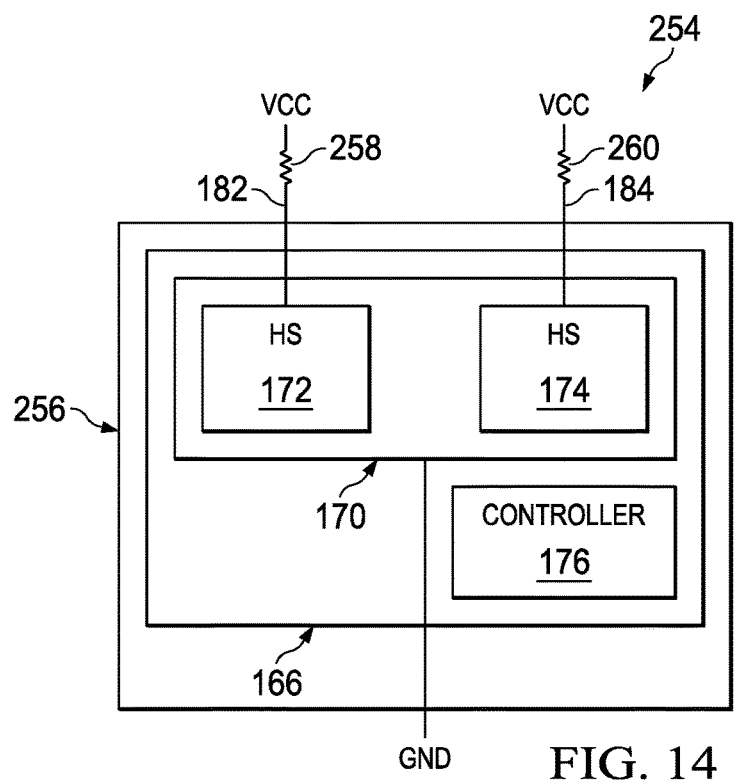

FIG. 14 is a conceptual diagram of an example system 254 according to this disclosure. System 254 may implement a full bridge circuit with HS current sensing. System 254 is similar to system 160 in FIG. 10 except that: (a) multi-chip package 162 has been replaced by multi-chip package 256; (b) sense resistor 164 has been omitted; and (c) sense resistors 258, 260 have been added to support HS current sensing. Multi-chip package 256 in FIG. 14 is similar to multi-chip package 162 in FIG. 10 except that: (a) controller die 176 is placed on top of thermal pad 166 instead of thermal pad 168; and (b) thermal pad 168 is omitted.

Respective first terminals of sense resistors 258, 260 are coupled to respective HS sense resistor terminals of multi-chip package 256 and to respective drain electrodes of HS FET dies 172, 174. Respective second terminals of sense resistors 258, 260 are coupled to a high supply voltage. Conductor 186 is coupled to the source terminal of combined LS FET die 170, thermal pad 166, and a low supply voltage terminal of multi-chip package 256.

As shown in FIG. 14, source substrate LS FETs are combined into a common die, and HS FETs are stacked with a clip. The current sense resistors are moved to the high side. When this is done, the LS FET source can be connected to ground. By stacking drain substrate HS FETS on top of source substrate LS FETs, a multi-phase bridge circuit may be implemented with a single die pad, thereby providing a low cost, reduced component, compact, and thermal efficient solution.

Figure 15:
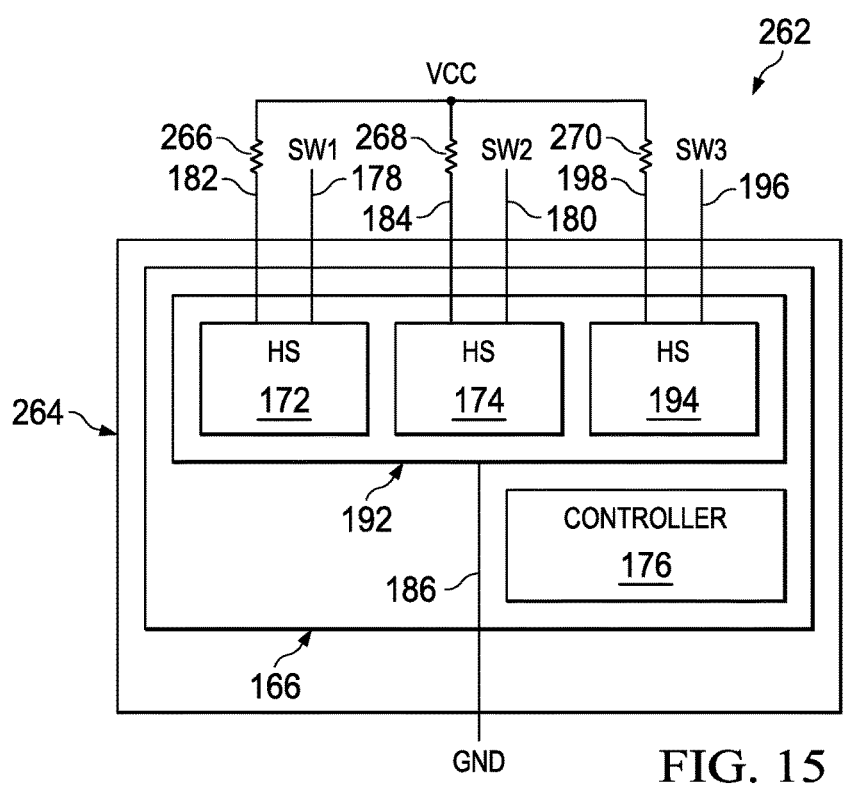

FIG. 15 is a conceptual diagram of an example system 262 according to this disclosure. System 262 may implement a three-phase bridge circuit with HS current sensing. System 262 is similar to system 188 in FIG. 11 except that: (a) multi-chip package 190 has been replaced by multi-chip package 264; (b) sense resistor 164 has been omitted; and (c) sense resistors 266, 268, 270 have been added to support HS current sensing. Multi-chip package 264 in FIG. 15 is similar to multi-chip package 190 in FIG. 11 except that: (a) controller die 176 is placed on top of thermal pad 166 instead of thermal pad 168; and (b) thermal pad 168 is omitted. This may allow use of a single thermal pad 166 thereby providing a low cost, reduced component, compact, and thermal efficient solution.

Respective first terminals of sense resistors 266, 268, 270 are coupled to respective HS sense resistor terminals of multi-chip package 264 and to respective drain electrodes of HS FET dies 172, 174, 194. Respective second terminals of sense resistors 266, 268, 270 are coupled to a high supply voltage. Conductor 186 is coupled to the source terminal of combined LS FET die 192, thermal pad 166, and a low supply voltage terminal of multi-chip package 264.

Figure 16:
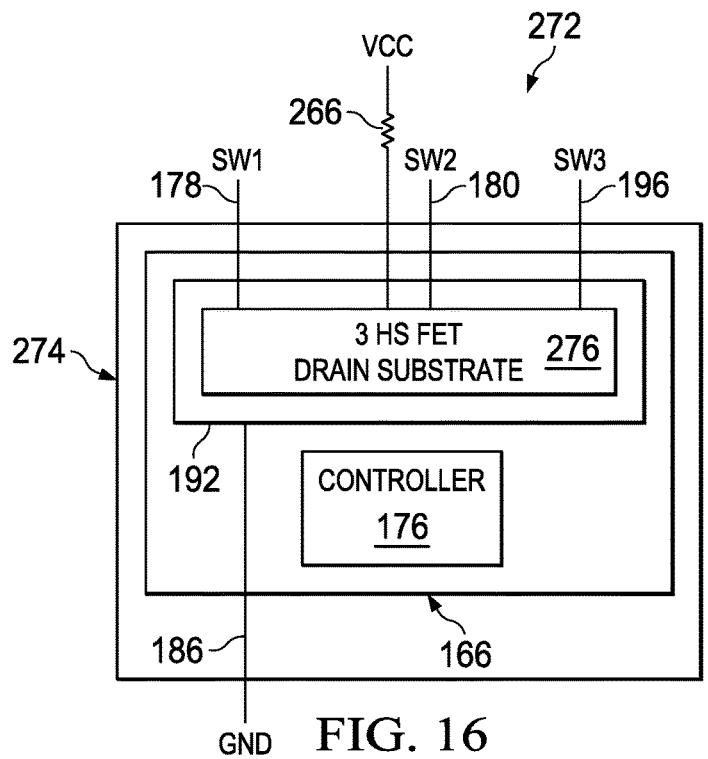

FIG. 16 is a conceptual diagram of an example system 272 according to this disclosure. System 272 may implement a three-phase bridge circuit with HS current sensing. System 272 is similar to system 262 in FIG. 15 except that: (a) multi-chip package 264 has been replaced by multi-chip package 274; and (b) sense resistors 268, 270 have been omitted. Multi-chip package 274 in FIG. 16 is similar to multi-chip package 264 in FIG. 15 except that HS FET dies 172, 174, 194 have been replaced by combined HS FET die 276. Combined HS FET die 276 may be similar to combined HS FET die 80 in FIG. 4. FET die 192, 276 may form a vertically-stacked FET die structure where a drain substrate combined HS FET die 276 is stacked on top of a source substrate combined LS FET die 192. A first terminal of sense resistor 266 is coupled to a drain terminal of combined HS FET die 276, and a second terminal of sense resistor 266 is coupled to a high supply voltage. This may allow use of a single thermal pad 166 thereby providing a low cost, reduced component, compact, and thermal efficient solution.

Figure 17:
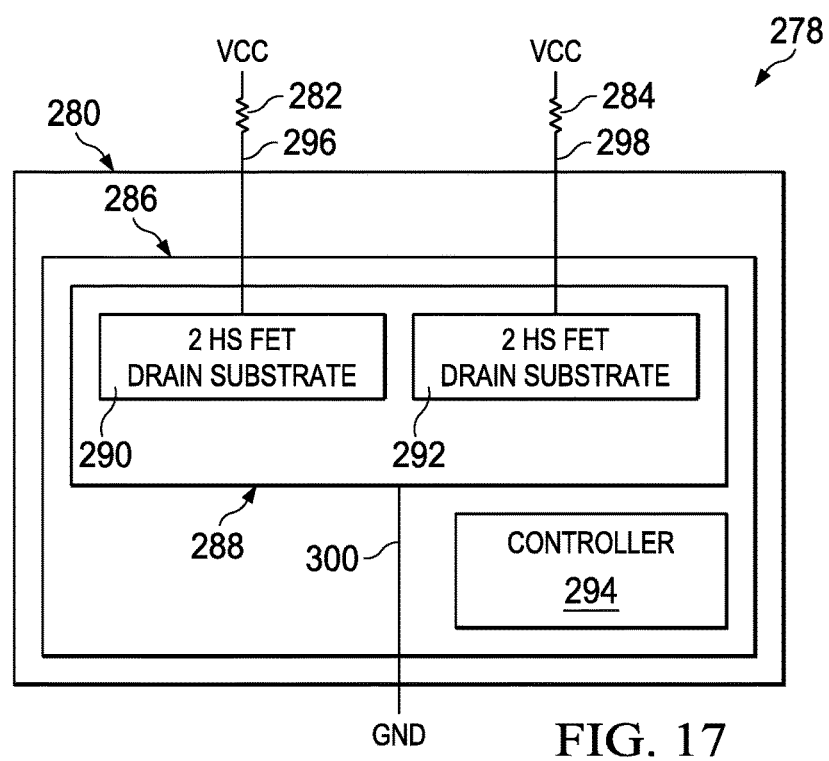

FIG. 17 is a conceptual diagram of an example system 278 according to this disclosure. System 278 may implement a dual bridge circuit with HS current sensing. System 278 includes a multi-chip package 280 and sense resistors 282, 284. Multi-chip package 280 includes a thermal pad 286, a combined LS FET die 288, combined HS FET dies 290, 292, a controller die 294 and conductors 296, 298, 300.

Combined LS FET die 288 is placed on top of thermal pad 286 such that a substrate of combined LS FET die 288 is directly connected to, electrically coupled to, and/or thermally coupled to thermal pad 286. Respective combined HS FET dies 290, 292 are stacked on top of combined LS FET die 288. Controller die 294 is placed on top of thermal pad 286 such that a substrate of controller die 294 is directly connected to, electrically coupled to, and/or thermally coupled to thermal pad 286.

Combined LS FET die 288 is similar to combined LS FET die 192 in FIG. 16 except that combined LS FET die 288 has four LS FETS instead of three LS FETS. Combined HS FET dies 290, 292 are each similar to combined HS FET die 116 in FIG. 6. Controller die 294 is similar to controller die 88 in FIG. 1.

Respective conductors 296, 298 are coupled between respective HS current sense terminals of multi-chip package 280 and respective drain terminals of combined HS FET dies 290, 292. Respective first terminals of sense resistors 282, 284 are coupled to respective HS current sense terminals of multi-chip package 280. Respective second terminals of sense resistors 282, 284 are coupled to a high supply voltage. Conductor 300 is coupled to a source terminal of combined LS FET die 288, thermal pad 286, and to a low supply voltage terminal of multi-chip package 280.

FET dies 288, 290, 292 may form a vertically-stacked FET die structure where two drain substrate combined HS FET dies 290, 292 are stacked on top of a source substrate combined LS FET die 288. Combined LS FET die 288 forms a lower die layer of the structure, and combined HS FET dies 290, 292 form an upper layer of the structure. Pour central layer clips may be disposed between the lower and upper layers of the structure. The four central layer clips may mechanically hold combined LS FET die 288 in place on thermal pad 286.

Figure 18:
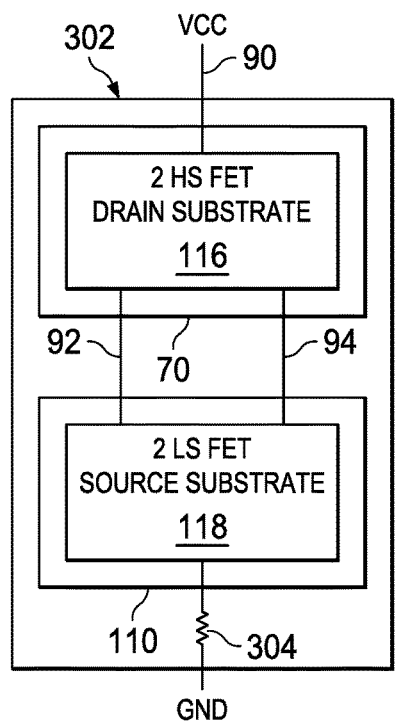

FIG. 18 is a conceptual diagram of an example multi-chip package 302 according to this disclosure. Multi-chip package 302 may implement a full bridge circuit with LS current sensing. Multi-chip package 302 is similar to multi-chip package 114 in FIG. 6 except that: (a) controller die 88 has been omitted; and (b) sense resistor 304 has been added. Sense resistor 304 is coupled between a source electrode of combined LS FET die 118 and a low supply voltage terminal of multi-chip package 302.

Figure 19:
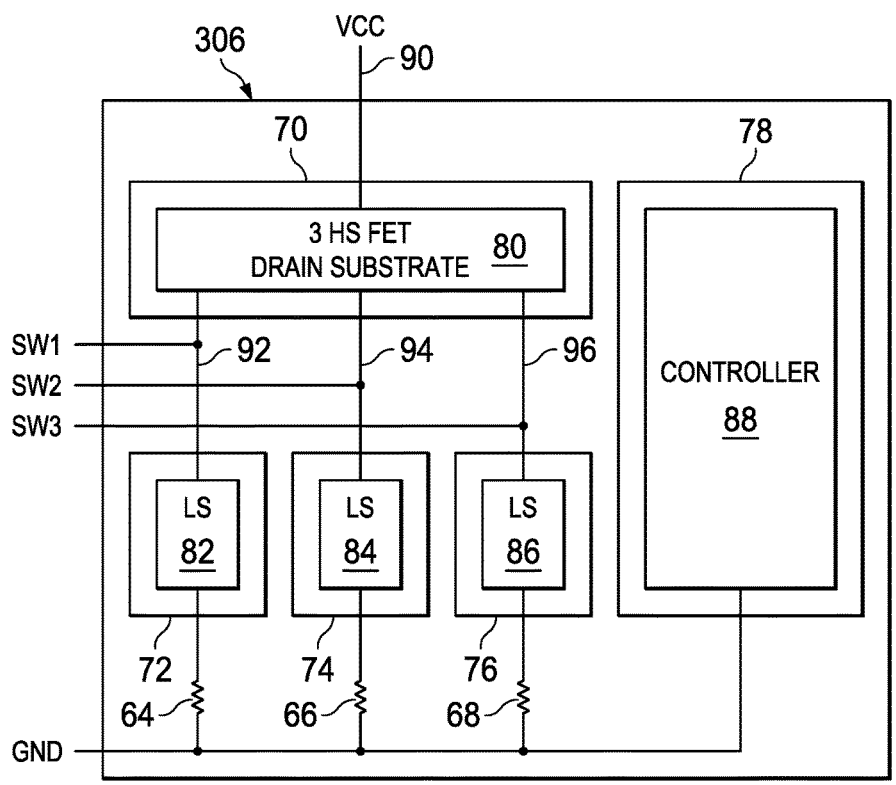

FIG. 19 is a conceptual diagram of an example multi-chip package 306 according to this disclosure. Multi-chip package 306 may implement a three-phase bridge circuit with LS current sensing. Multi-chip package 306 is similar to multi-chip package 62 in FIG. 4 except that sense resistors 64, 66, 68 are included in multi-chip package 306 instead of being external. Sense resistors 64, 66, 68 are coupled between respective source electrodes of LS FET dies 82, 84, 86 and a common low supply voltage terminal of multi-chip package 306.

Figure 20:
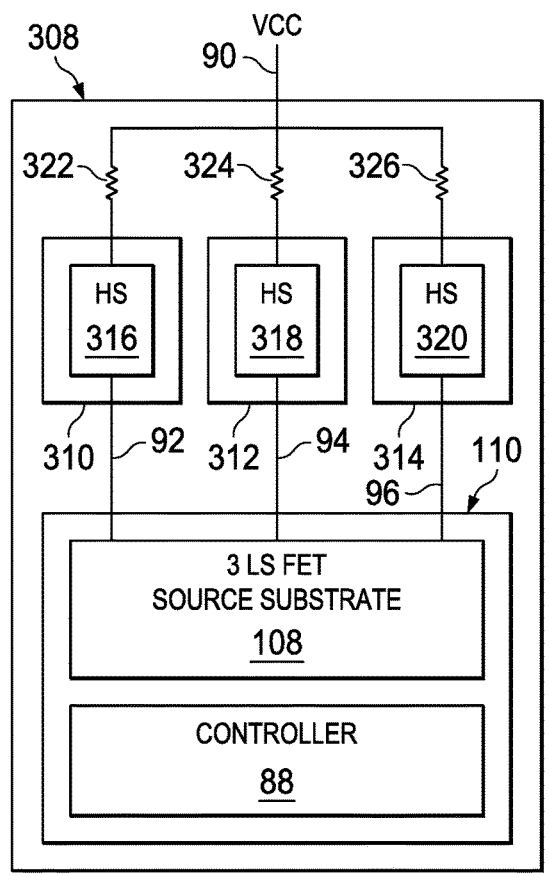

FIG. 20 is a conceptual diagram of an example multi-chip package 308 according to this disclosure. Multi-chip package 308 may implement a three-phase bridge circuit with HS current sensing. Multi-chip package 308 is similar to multi-chip package 106 in FIG. 5 except that; (a) thermal pad 70 and combined HS FET die 80 are replaced by three separate HS FET dies 316, 318, 320 on three separate thermal pads 310, 312, 314; and (b) sense resistors 322, 324, 326 are coupled between respective drain terminals of HS FET dies 316, 318, 320 and a high supply voltage terminal of multi-chip package 308. Combined LS FET die 108 includes three source substrate LS FETs. HS FET dies 316, 318, 320 may include either source substrate or drain substrate HS FETs.

Figure 21:
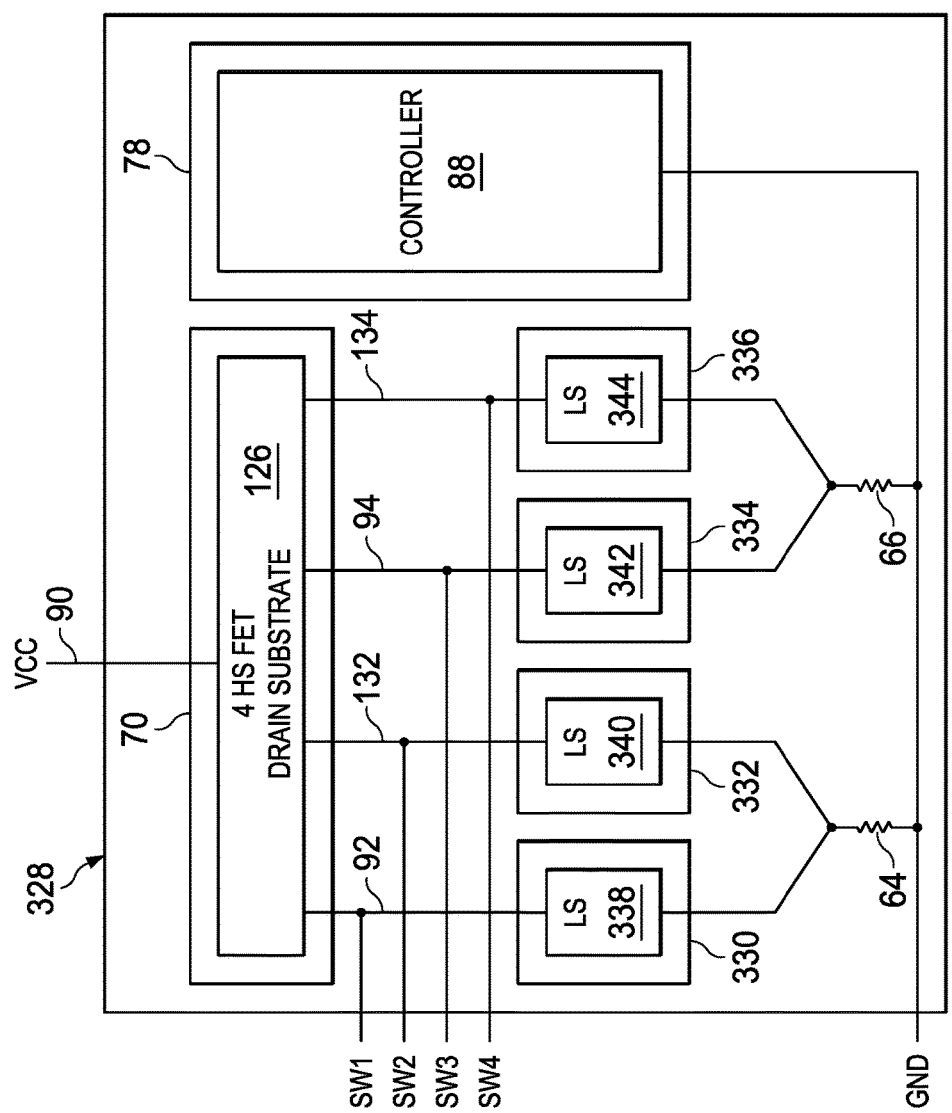

FIG. 21 is a conceptual diagram of an example multi-chip package 328 according to this disclosure. Multi-chip package 328 may implement a dual bridge circuit with LS current sensing. Multi-chip package 328 is similar to multi-chip package 124 in FIG. 7 except that: (a) thermal pad 72 and combined LS FET die 128 are replaced by two separate LS FET dies 338, 340 on two separate thermal pads 330, 332; (b) thermal pad 74 and combined LS FET die 130 are replaced by two separate LS FET dies 342, 344 on two separate thermal pads 334, 336; and (c) sense resistors 64, 66 are included in multi-chip package 328. Sense resistor 64 is coupled between respective source terminals of LS FET dies 338, 340 a low supply voltage terminal of multi-chip package 328. Sense resistor 66 is coupled between respective source terminals of LS FET dies 342, 344 and a low supply terminal of multi-chip package 328. Combined HS FET die 126 includes four drain substrate HS FETs. LS FET dies 338, 340, 342, 344 may include either source substrate or drain substrate LS FETs.

Figure 22:
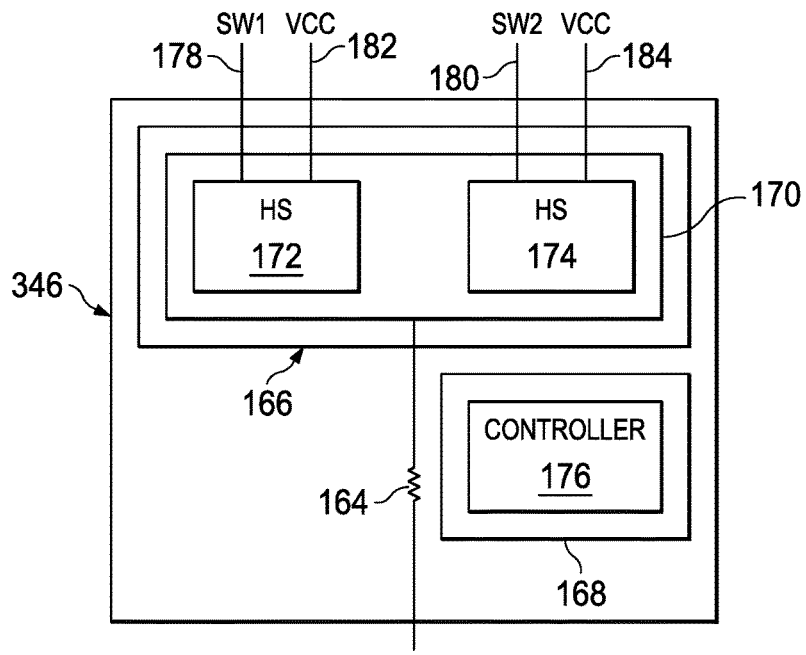

FIG. 22 is a conceptual diagram of an example multi-chip package 346 according to this disclosure. Multi-chip package 346 may implement a full-bridge circuit with LS current sensing. Multi-chip package 346 is similar to multi-chip package 162 in FIG. 10 except that sense resistor 164 has been moved inside of multi-chip package 346 instead of being external to the package. Sense resistor 164 is coupled between a source electrode of combined LS FET die 170 and a low supply voltage terminal of multi-chip package 346.

Figure 23:
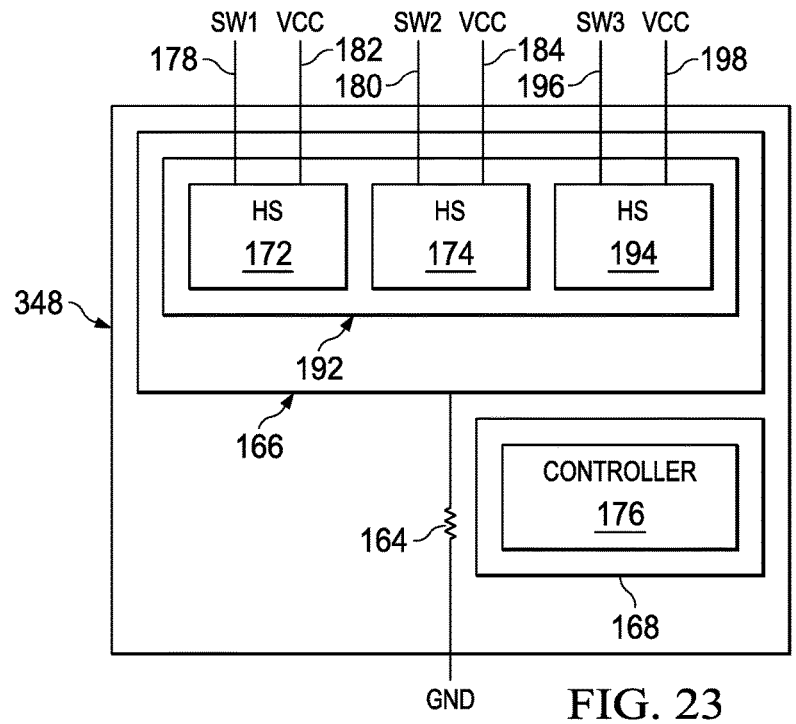

FIG. 23 is a conceptual diagram of an example multi-chip package 348 according to this disclosure. Multi-chip package 348 may implement a three-phase bridge circuit with LS current sensing. Multi-chip package 348 is similar to multi-chip package 190 in FIG. 11 except that sense resistor 164 has been moved inside of multi-chip package 348 instead of being external to the package. Sense resistor 164 is coupled between a source electrode of combined LS FET die 192 and a low supply voltage terminal of multi-chip package 348.

Figure 24:
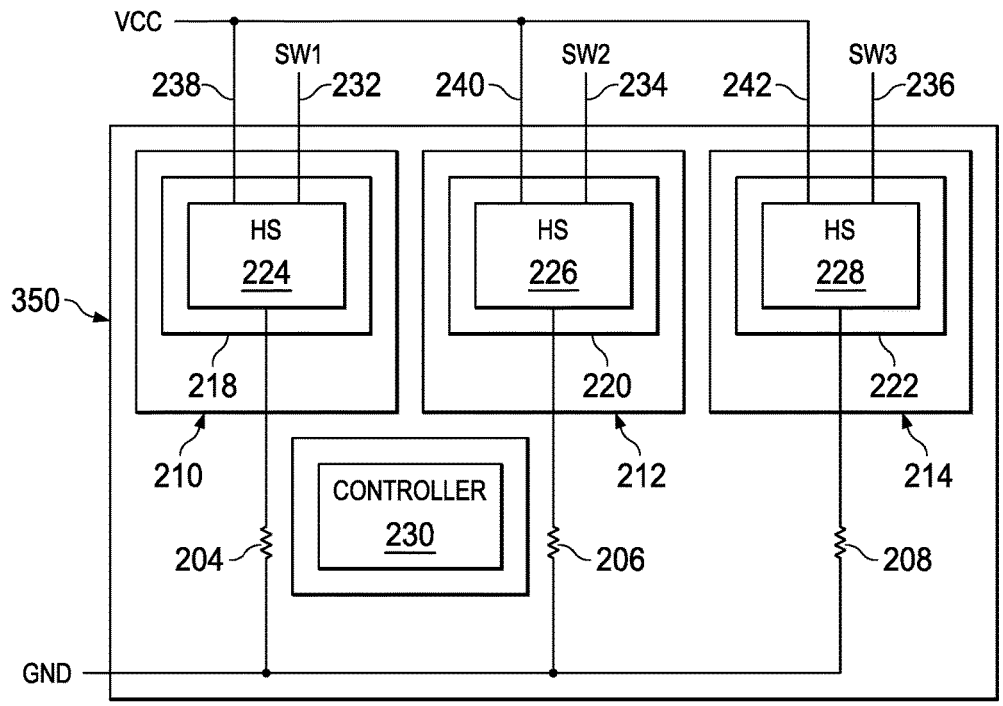

FIG. 24 is a conceptual diagram of an example multi-chip package 350 according to this disclosure. Multi-chip package 350 may implement a three-phase bridge circuit with LS current sensing for each phase. Multi-chip package 350 is similar to multi-chip package 202 in FIG. 12 except that sense resistors 204, 206, 208 have been moved inside of multi-chip package 350 instead of being external to the package. Sense resistors 204, 206, 208 are coupled between respective source electrodes of LS FET dies 224, 226, 228 and a low supply voltage terminal of multi-chip package 350.

Figure 25:
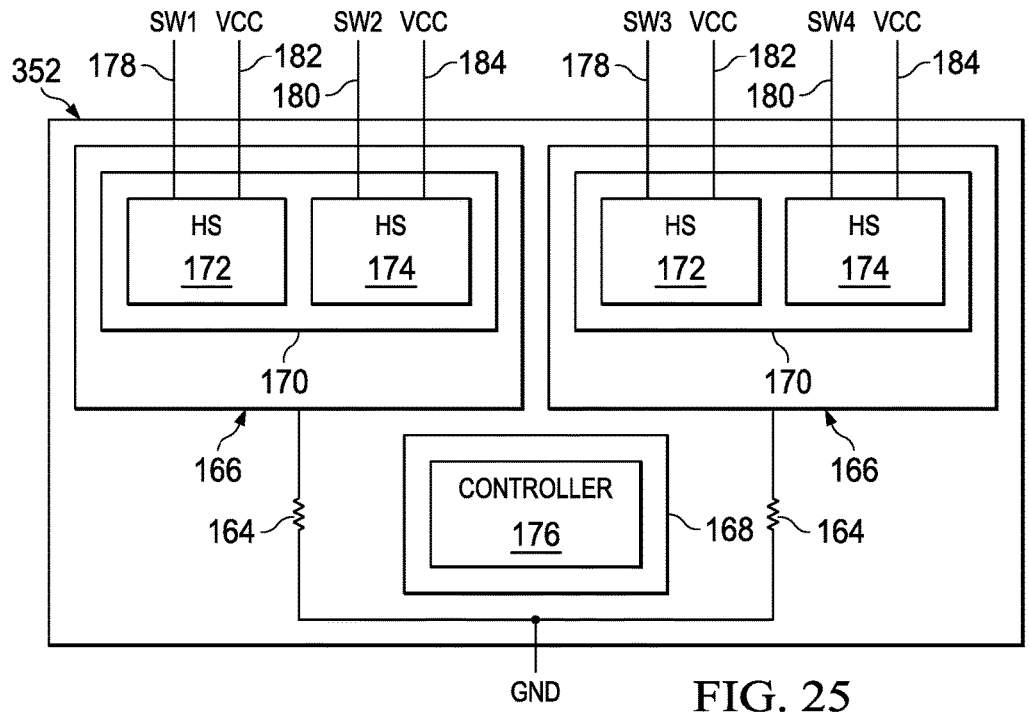

FIG. 25 is a conceptual diagram of an example multi-chip package 352 according to this disclosure. Multi-chip package 352 may implement a dual bridge circuit with LS current sensing. Multi-chip package 352 is similar to multi-chip package 252 in FIG. 13 except that sense resistors 164 have been moved inside of multi-chip package 352 instead of being external to the package. Respective sense resistors 164 are coupled between respective source electrodes of LS FET dies 170 and a low supply voltage terminal of multi-chip package 352.

Figure 26:
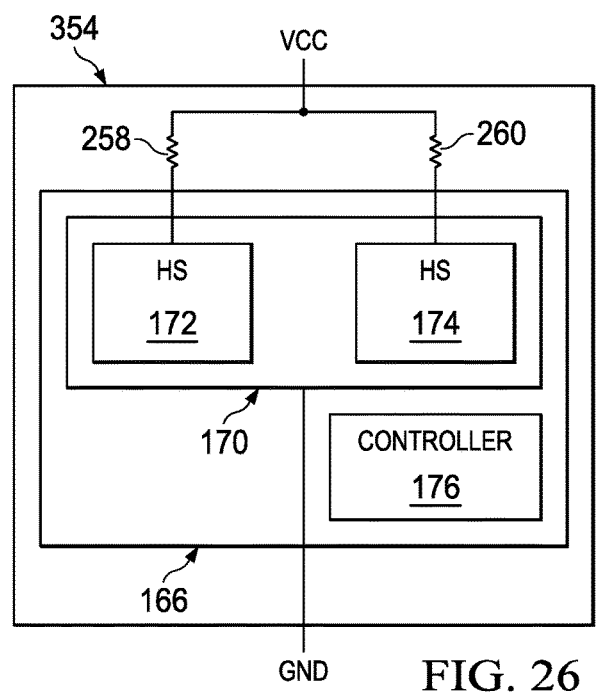

FIG. 26 is a conceptual diagram of an example multi-chip package 354 according to this disclosure. Multi-chip package 354 may implement a full-bridge circuit with HS current sensing. Multi-chip package 354 is similar to multi-chip package 256 in FIG. 14 except that sense resistors 258, 260 have been moved inside of multi-chip package 354 instead of being external to the package. Respective sense resistors 258, 260 are coupled between respective drain electrodes of HS FET dies 172, 174 and a high supply voltage terminal of multi-chip package 354.

Figure 27:
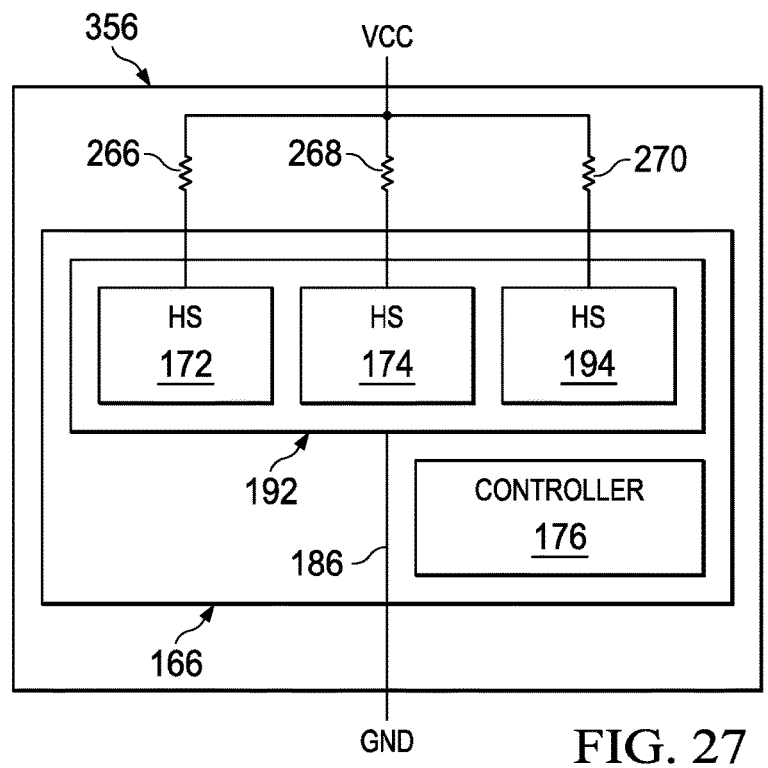

FIG. 27 is a conceptual diagram of an example multi-chip package 356 according to this disclosure. Multi-chip package 356 may implement a three-phase bridge circuit with current sensing. Multi-chip package 356 is similar to multi-chip package 264 in FIG. 15 except that sense resistors 266, 268, 270 have been moved inside of multi-chip package 356 instead of being external to the package. Respective sense resistors 266, 268, 270 are coupled between respective drain electrodes of HS FET dies 172, 174, 194 and a high supply voltage terminal of multi-chip package 356.

Figure 28:
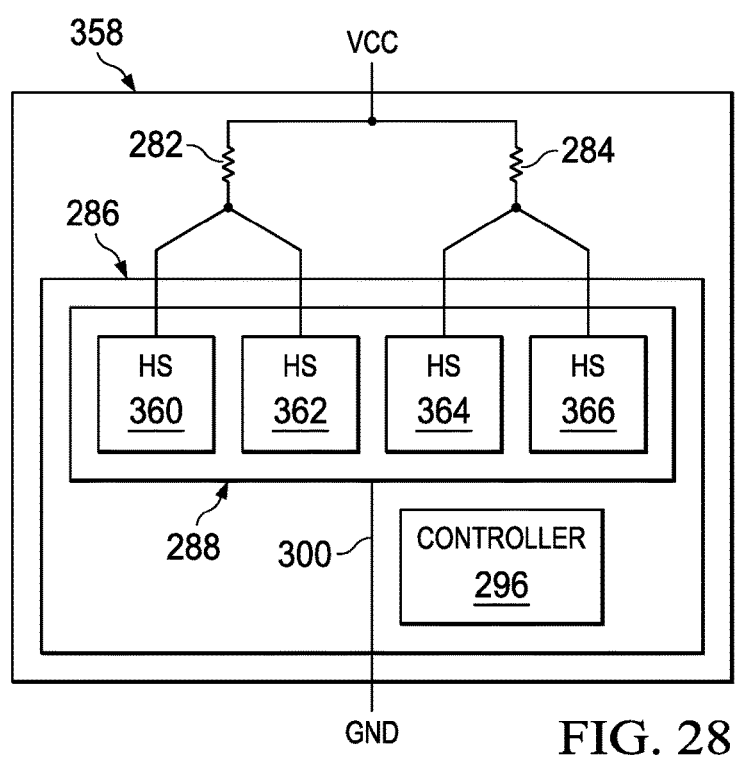

FIG. 28 is a conceptual diagram of an example multi-chip package 358 according to this disclosure. Multi-chip package 358 may implement a dual bridge circuit with HS current sensing. Multi-chip package 358 is similar to multi-chip package 280 in FIG. 17 except that: (a) combined HS FET die 290 is replaced by two separate HS FET dies 360, 362; (b) combined HS FET die 292 is replaced by two separate HS FET dies 364, 366; and (c) sense resistors 282, 284 have been moved inside of multi-chip package 358 instead of being external to the package. Respective sense resistors 282, 284 are coupled between respective drain electrodes of HS FET dies 360, 362, 364, 366 and a high supply voltage terminal of multi-chip package 358. Combined LS FET die 288 includes four source substrate LS FETs. FET dies 360, 362, 364, 366 may include either source substrate or drain substrate HS FETs.

FET dies 288, 360, 362, 364, 366 may form a vertically-stacked FET die structure where combined LS FET die 288 forms a lower die layer of the structure, and HS FET dies 360, 362, 364, 366 form an upper layer of the structure. Four central layer clips may be disposed between the lower and upper layers of the structure. The four central layer clips may mechanically hold combined LS FET die 288 in place on thermal pad 286.

Figure 29:
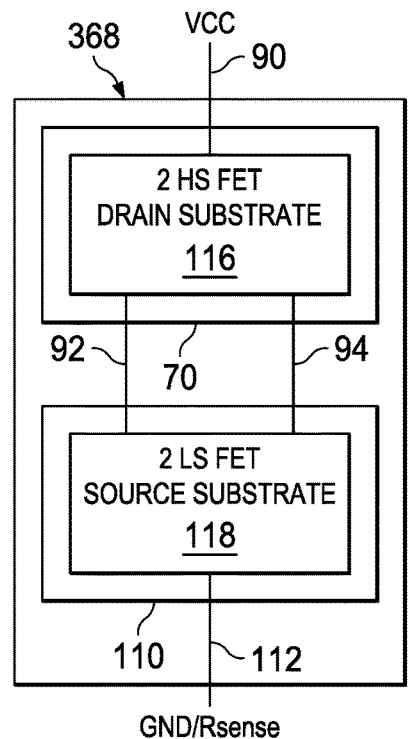

FIG. 29 is a conceptual diagram of an example multi-chip package 368 according to this disclosure. Multi-chip package 368 may implement a full-bridge circuit. Multi-chip package 368 is similar to multi-chip package 302 in FIG. 18 except that sense resistor 304 has been omitted. Conductor 112 may be coupled to a low supply voltage terminal (GND) or an LS sense resistor terminal (Rsense) of multi-chip package 368.

Figure 30:
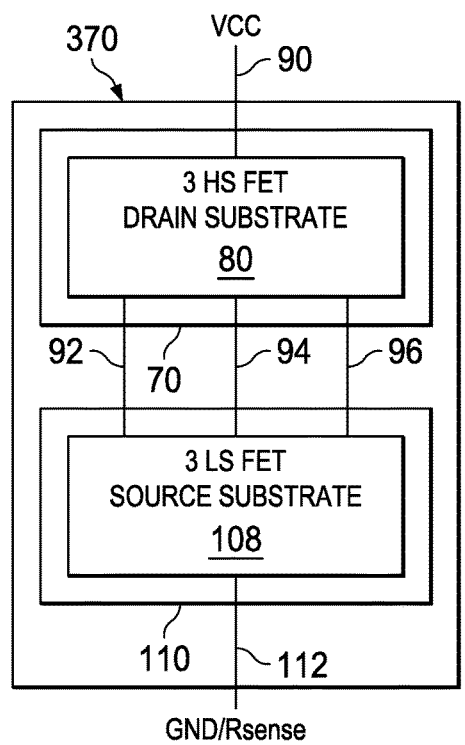

FIG. 30 is a conceptual diagram of an example multi-chip package 370 according to this disclosure. Multi-chip package 370 may implement a three-phase bridge circuit. Multi-chip package 370 is similar to multi-chip package 106 in FIG. 5 except that controller die 88 has been omitted. Conductor 112 may be coupled to a low supply voltage terminal (GND) or an LS sense resistor terminal (Rsense) of multi-chip package 370.

Figure 31:
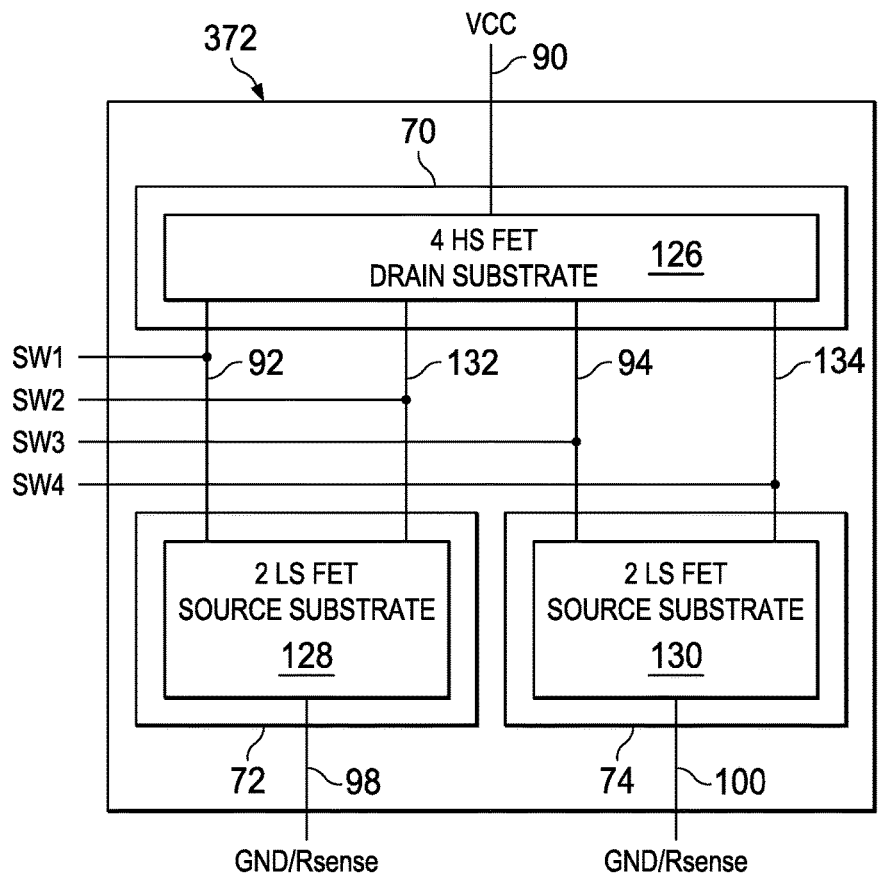

FIG. 31 is a conceptual diagram of an example multi-chip package 372 according to this disclosure. Multi-chip package 372 may implement a dual bridge circuit. Multi-chip package 372 is similar to multi-chip package 124 in FIG. 7 except that thermal pad 78, controller die 88, and sense resistors 64, 66 have been omitted. Conductors 98, 100 may be coupled to a low supply voltage terminal (GND) or an LS sense resistor terminal (Rsense) of multi-chip package 370.

Figure 32:
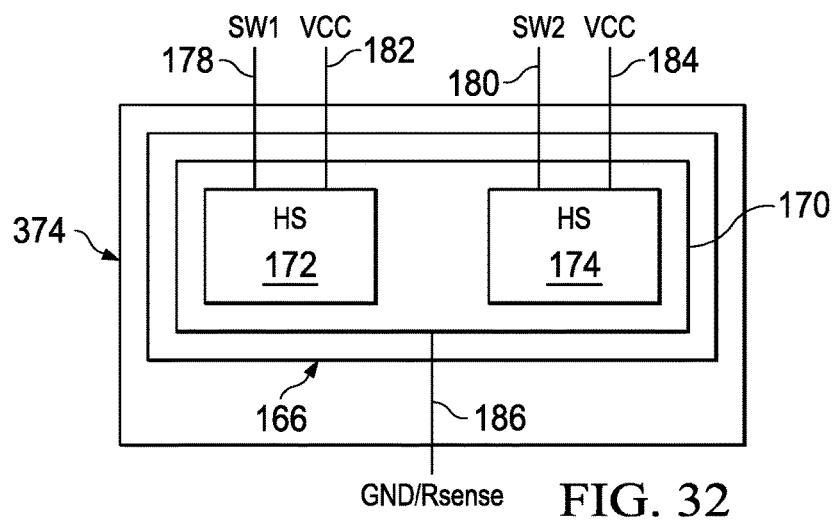

FIG. 32 is a conceptual diagram of an example multi-chip package 374 according to this disclosure. Multi-chip package 374 may implement a full-bridge circuit. Multi-chip package 374 is similar to multi-chip package 162 in FIG. 10 except that sense resistor 164 has been omitted. Conductor 186 may be coupled to a low supply voltage terminal (GND) or an LS sense resistor terminal (Rsense) of multi-chip package 374.

Figure 33:
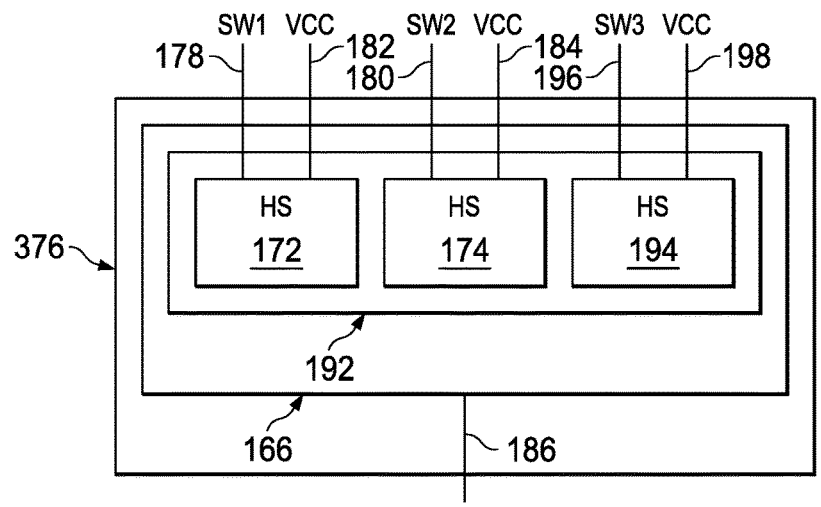

FIG. 33 is a conceptual diagram of an example multi-chip package 376 according to this disclosure. Multi-chip package 376 may implement a three-phase bridge circuit. Multi-chip package 376 is similar to multi-chip package 190 in FIG. 11 except that sense resistor 164 has been omitted. Conductor 186 may be coupled to a low supply voltage terminal (GND) or an LS sense resistor terminal (Rsense) of multi-chip package 376.

Figure 34:
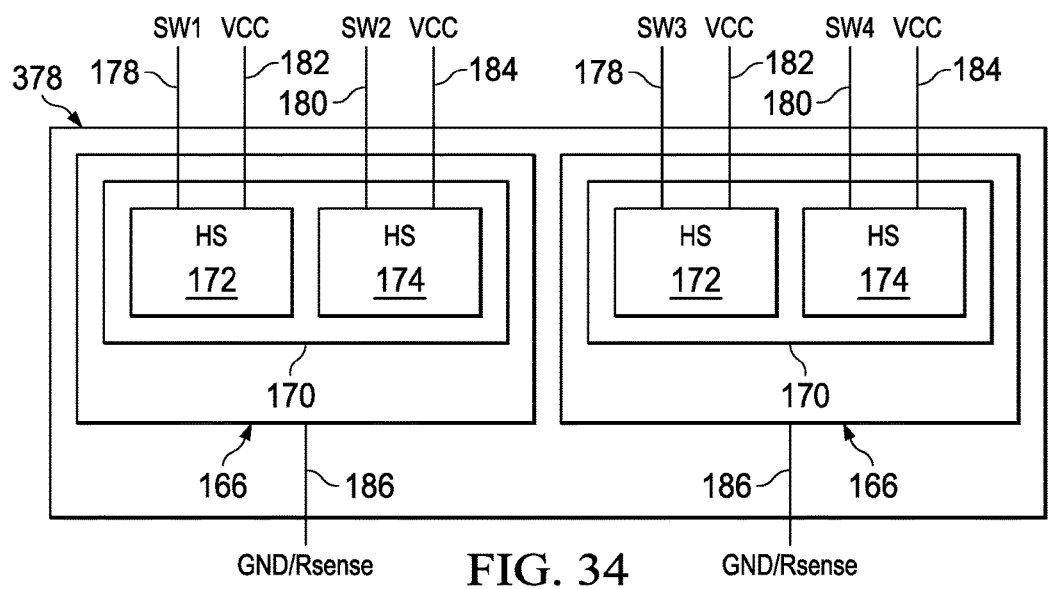

FIG. 34 is a conceptual diagram of an example multi-chip package 378 according to this disclosure. Multi-chip package 378 may implement a dual bridge circuit. Multi-chip package 378 is similar to multi-chip package 252 in FIG. 13 except that sense resistors 164, 164 have been omitted. Conductors 186, 186 may be coupled to respective low supply voltage terminals (GND) or respective LS sense resistor terminals (Rsense) of multi-chip package 378.

This disclosure described power FET and controller integration techniques for multi-phase and multi-output power applications. In power converters and motor drivers the techniques of this disclosure may, in some examples, provide a significant benefit in integrating the power electronics. The techniques of this disclosure may, in some examples, reduce physical size or area, increase power density, provide a single package solution for customers, reduce parasitics, and/or reduce system cost. The advantages may become increasingly important as the number of phases or outputs increases.

According to a first technique of this disclosure, the HS FETs may be combined into a common die, and the LS FETs may be optionally combined into another common die. Combining the HS FETs and optionally the LS FETs onto common dies, the number of thermal pads may be reduced, thereby providing a more cost effective, area efficient and thermally efficient solution.

For a given size of HS FET, combining the HS FETs into a single die may increase the power density in the package making thermal dissipation a problem. Thermal issues may be alleviated or reduced by increasing the FET size. The FET size may be increased because there is more space available when the FETs are combined and some of the savings in packaging cost can be allocated to increasing the size of the FETs. When the FET size is increased, the corresponding on resistance may be reduced. Reducing the on resistance may reduce the power dissipation, thereby reducing thermal dissipation issues.

Drain as substrate FETs may be used combining HS FETs because, in multi-phase architectures, the HS FETS drains may be connected together to a single supply. In some examples, drain as substrate FETs may not be used for the LS FETs if the drains of the LS FETs are at different potentials.

However, for applications with no sense resistors on the low side, source as substrate FETs may be used to implement the LS FETs. This may allow the LS FETs to be combined into a single die and further allow the sources to be connected together and to a common ground potential (GND). This may allow all LS FETS and pre-driver substrates to be implemented on a common thermal and pad and be connected to the ground potential. This may further reduce the number of pads, and provide further improvements in cost, area, and thermal efficiency.

According to a second technique of this disclosure, the LS and HS FETs may be stacked with a clip in between the FETs for implementing a switch node. In some examples, multiple LS source substrate FETs may be combined into a common die to make the die bigger and reduce thermal issues. Then, HS drain substrate FETs may be stacked on top of the combined LS FET die, thereby achieving a compact, cost effective thermal pad solution. In some examples, two thermal pads may be used because the low side substrate may not be at ground due to sense resistor being at the bottom. The LS substrate may use its own pad and pre-driver pad can be connected to ground.

According to a third technique of this disclosure, source substrate LS FETs are combined into a common die, and HS FETs are stacked with a clip. This technique may allow a multi-phase bridge circuit to be made with a single thermal pad. The current sense resistors may be moved to the high side. When this is done, the LS FET source can be connected to ground. If LS FETS with source substrate are used, and HS drain substrate FETS are stacked on top of it, the multi-phase bridge circuit may be implemented with a single die pad, thereby providing a low cost, reduced component, compact, and thermal efficient solution.

The techniques in this disclosure may integrate high-side and low-side FETs for multi-phase applications into a single package. These techniques may reduce the number of die in the package, reduce the number of die pads, in some examples, to a single ground pad, which may be connected to metal body for excellent thermal dissipation. This allows applications such as multiphase converters and motor drivers to be implemented with reduced size packages and increased power density.

In some examples, the techniques of this disclosure may integrate power FETs and pre-drivers/controllers into one package. In some cases, the package may not include sense resistors. In further examples, the techniques of this disclosure may integrate power FETs, pre-drivers/controllers and sense resistors into one package. In additional examples, the techniques of this disclosure may integrate power FETs into one package without controllers or sense resistors.

In examples that include a controller die, the controller die may, in some cases, include both controller circuitry and driver circuitry. In such cases, the controller die may be alternatively referred to as a controller/driver die. In some examples, a driver die may replace the controller die.

In some examples, a multi-chip package may include a first die that includes at least one LS FET, and a second die that includes at least one of a control circuit or a driver circuit. In such examples, the first die and the second die may be disposed on a common thermal pad.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. A multi-chip package comprising:
   at least two low-side (LS) field-effect transistors (FETs);
   at least two high-side (HS) FETs;
   a first die that includes the at least two LS FETs;
   a second die that includes a first HS FET of the at least two HS FETs; and
   a third die that includes a second HS FET of the at least two HS FETs, wherein the second and third dies are vertically-stacked on top of the first die.

2. The multi-chip package of claim 1, further comprising:
   a first clip positioned between the first die and the second die and coupled to a drain electrode of a first LS FET of the at least two LS FETs, and to a source electrode of the first HS FET; and
   a second clip positioned between the first die and the third die and coupled to a drain electrode of a second LS FET of the at least two LS FETs, and to a source electrode of the second HS FET.

3. The multi-chip package of claim 1, further comprising:
   a fourth die that includes a controller circuit.

4. The multi-chip package of claim 1, further comprising:
   a first resistor coupled to a drain electrode of the first HS FET; and
   a second resistor coupled to a drain electrode of the second HS FET.

5. The multi-chip package of claim 1, further comprising:
   a fourth die that includes a driver circuit.

6. The multi-chip package of claim 1, further comprising:
   a resistor coupled to a drain electrode of at least one of the first and second HS FETs.

7. The multi-chip package of claim 1, further comprising:
   a thermal pad;
   and
   a fourth die that includes at least one of a controller circuit or a driver circuit, wherein the first die and the fourth die are disposed on the thermal pad.

8. The multi-chip package of claim 4, further comprising:
a terminal, wherein the first and second resistors are both coupled to the terminal.

9. The multi-chip package of claim 8, further comprising:
a thermal pad; and
a fourth die that includes at least one of a controller circuit or a driver circuit,
wherein the first die and the fourth die are disposed on the thermal pad.

10. The multi-chip package of claim 6, further comprising:
a thermal pad; and
a fourth die that includes at least one of a controller circuit or a driver circuit,
wherein the first die and the fourth die are disposed on the thermal pad.

11. The multi-chip package of claim 1, wherein the at least two LS FETs include first, second, and third LS FETs, the multi-chip package further comprising:
a fourth die that includes a third HS FET, wherein the fourth die is vertically-stacked on top of the first die.

12. The multi-chip package of claim 1, wherein the at least two LS FETs include first, second, third, and fourth LS FETs, the multi-chip package further comprising:
a fourth die that includes a third HS FET; and
a fifth die that includes a fourth HS FET, wherein the fourth and fifth dies are vertically-stacked on top of the first die.

13. The multi-chip package of claim 1, wherein the at least two LS FETs include first and second LS FETs, the multi-chip package further comprising:
a fourth die that includes third and fourth LS FETs;
a fifth die that includes a third HS FET; and
a sixth die that includes a fourth HS FET, wherein the fifth and sixth dies are vertically-stacked on top of the fourth die.

14. The multi-chip package of claim 13, further comprising:
a seventh die that includes at least one of a controller circuit or a driver circuit.

15. The multi-chip package of claim 13, further comprising:
a first resistor coupled to an electrode of the first die; and
a second resistor coupled to an electrode of the fourth die.

16. The multi-chip package of claim 15, wherein the first and second LS FETs share a first common substrate, the third and fourth LS FETs share a second common substrate, the electrode of the first die is formed on the first common substrate, and the electrode of the fourth die is formed on the second common substrate.

17. The multi-chip package of claim 15, further comprising:
a terminal, wherein the first and second resistors are both coupled to the terminal.

18. The multi-chip package of claim 15, further comprising:
a seventh die that includes at least one of a controller circuit or a driver circuit.

19. The multi-chip package of claim 1,
wherein the at least two LS FETs include first, second, third, and fourth LS FETs,
wherein the second die further includes a third HS FET, and
wherein the third die further includes a fourth HS FET.

20. The multi-chip package of claim 19, further comprising:
a fourth die that includes at least one of a controller circuit or a driver circuit.

21. The multi-chip package of claim 20, further comprising:
a thermal pad, wherein the first and fourth dies are disposed on the thermal pad.

* * * * *